US007190289B2

(12) United States Patent
Kobayashi et al.

(10) Patent No.: US 7,190,289 B2
(45) Date of Patent: Mar. 13, 2007

(54) SIGNAL ENCODING METHOD, SIGNAL DECODING METHOD, SIGNAL ENCODING APPARATUS, SIGNAL DECODING APPARATUS, SIGNAL ENCODING PROGRAM, AND SIGNAL DECODING PROGRAM

(75) Inventors: Mitsuru Kobayashi, Yokohama (JP); Minoru Etoh, Yokohama (JP); Satoru Adachi, Yokohama (JP); Choong Seng Boon, Yokohama (JP)

(73) Assignee: NTT DoCoMo, Inc., Tokyo (JP)

( * ) Notice: Subject to any disclaimer, the term of this patent is extended or adjusted under 35 U.S.C. 154(b) by 1 day.

(21) Appl. No.: 10/972,952

(22) Filed: Oct. 26, 2004

(65) Prior Publication Data

US 2005/0146451 A1    Jul. 7, 2005

Related U.S. Application Data

(63) Continuation of application No. PCT/JP03/05401, filed on Apr. 25, 2003.

(30) Foreign Application Priority Data

Apr. 26, 2002  (JP)  ............................ P2002-127534
Jul. 29, 2002  (JP)  ............................ P2002-220316

(51) Int. Cl.
*H03M 7/00* (2006.01)

(52) U.S. Cl. ....................................... 341/107; 382/247
(58) Field of Classification Search ................ 341/107, 341/50, 51, 106; 382/247, 248
See application file for complete search history.

(56) References Cited

U.S. PATENT DOCUMENTS 5,321,521 A * 6/1994 Nomizu ................. 358/426.12

5,406,282 A    4/1995 Nomizu (Continued)

FOREIGN PATENT DOCUMENTS

JP          5-122534          5/1993

(Continued)

OTHER PUBLICATIONS

Mark Nelson, et al., "The Data Compression Book 2nd Edition", M&T Books, 1995, pp. 113-123, no month.

(Continued)

*Primary Examiner*—Peguy JeanPierre
(74) *Attorney, Agent, or Firm*—Brinks Hofer Gilson & Lione

(57) ABSTRACT

A signal encoding method according to the present invention is a signal encoding method of dividing a coding target signal as an object of coding into partition units and performing arithmetic coding based on probability-related information in the partition units, which comprises (1) a configuration information deriving step of analyzing the coding target signal in each of the partition units to derive as configuration information, information about an initial value of the probability-related information used for the arithmetic coding of the coding target signal in the partition unit in question; (2) a coding step of performing the arithmetic coding of the coding target signal in each of the partition units, based on the configuration information derived in the configuration information deriving step; and (3) a configuration information adding step of adding a header containing the configuration information to the arithmetic-coded signal in each of the partition units.

84 Claims, 22 Drawing Sheets

U.S. PATENT DOCUMENTS

| | | | |
|---|---|---|---|
| 6,351,569 B1* | 2/2002 | Kimura et al. | 382/247 |
| 6,952,432 B2* | 10/2005 | Watanabe et al. | 370/522 |
| 2002/0021234 A1* | 2/2002 | Yanagiya et al. | 341/107 |
| 2002/0040413 A1* | 4/2002 | Okada et al. | 710/68 |
| 2004/0013311 A1* | 1/2004 | Hirao | 382/240 |
| 2005/0152610 A1* | 7/2005 | Hagiwara et al. | 382/239 |

FOREIGN PATENT DOCUMENTS

| | | |
|---|---|---|
| JP | 5-130428 | 5/1993 |
| JP | H05-130428 | 5/1993 |
| JP | 9-121359 | 5/1997 |
| JP | 11-341496 | 12/1999 |
| JP | 11-341497 | 12/1999 |
| JP | 2000-209442 | 7/2000 |
| JP | H10-215228 | 8/2005 |
| JP | 2005-347780 | 12/2005 |

OTHER PUBLICATIONS

H.26L Test Model Long Term No. 8 (TML-8) draft0., ITU—Telecommunications Standardization Sector Study Group 16 Video Conding Experts Group (VCEG), Generated Jun. 28, 2001, pp. 1-46.

Fumitaka Ono, et al, "Basic Technologies on International Image Coding Standards", published Mar. 20, 1998 by Corona Publishing Co., Ltd., pp. 164-177.

Korean Office Action mailed Apr. 24, 2006.

Japanese Office Action mailed Apr. 18, 2006.

* cited by examiner mode0
Skip mode1
Inter
16 × 16 mode2
Inter
16 × 8 mode3
Inter
8 × 16 mode4
Inter
8 × 8 mode5
Inter
8 × 4 mode6
Inter
4 × 8 mode7
Inter
4 × 4 mode8
Intra
4 × 4 mode9
Intra
16 × 16

Fig.4A

HORIZONTAL COORDINATES →

VERTICAL COORDINATES ↓

| $a_{11}$ | $a_{12}$ | $a_{13}$ | $a_{14}$ |
|---|---|---|---|
| $a_{21}$ | $a_{22}$ | $a_{23}$ | $a_{24}$ |
| $a_{31}$ | $a_{32}$ | $a_{33}$ | $a_{34}$ |
| $a_{41}$ | $a_{42}$ | $a_{43}$ | $a_{44}$ |

Fig.4B

HORIZONTAL REQUENCIES →

VERTICAL FREQUENCIES ↓

| $f_{11}$ | $f_{12}$ | $f_{13}$ | $f_{14}$ |
|---|---|---|---|
| $f_{21}$ | $f_{22}$ | $f_{23}$ | $f_{24}$ |
| $f_{31}$ | $f_{32}$ | $f_{33}$ | $f_{34}$ |
| $f_{41}$ | $f_{42}$ | $f_{43}$ | $f_{44}$ |

*Fig.7*

| INITIAL VALUE | CODE |
|---|---|
| 1 | 1 |
| 2 | 001 |
| 3 | 011 |
| 4 | 00001 |
| 5 | 00011 |
| 6 | 01001 |
| 7 | 01011 |
| 8 | 0000001 |
| ... | ... |

Fig.12A

| NO. | INITIAL VALUES | | CODE |
|---|---|---|---|
| 0 | 0 | 1 | |
| 1 | 1 | 1 | 0 |
| 2 | 1 | 2 | 100 |
| 3 | 2 | 1 | 101 |
| 4 | 1 | 3 | 1100 |
| 5 | 3 | 1 | 1101 |
| 6 | 2 | 3 | 11100 |
| 7 | 3 | 2 | 11101 |
| 8 | 1 | 4 | 111100 |
| 9 | 4 | 1 | 111101 |
| 10 | 3 | 4 | 1111100 |
| | 4 | 3 | 1111101 |
| 11- | escape | | 111111 |

Fig.12B

| NO. | MULTIPLIER | CODE |
|---|---|---|
| 0 | 1 | 0 |
| 1 | 2 | 10 |
| 2 | 3 | 110 |
| 3 | 4 | 1110 |
| 4 | 5 | 11110 |
| 5 | 6 | 111110 |

Fig.12C

| NO. | INITIAL VALUES | | CODE |
|---|---|---|---|
| 0 | 0 | 1 | |
| 1 | 5 | 1 | 0 |
| 2 | 6 | 1 | 10 |
| 3 | 4 | 1 | 110 |
| 4 | 7 | 1 | 1110 |
| 5 | 3 | 1 | 1111 |
| 6 | 8 | 1 | 11100 |
| 7 | 2 | 1 | 11101 |
| 8 | 9 | 1 | 111100 |
| 9 | 1 | 1 | 111101 |
| 10 | 10 | 1 | 1111100 |
| | 1 | 2 | 1111101 |
| 11- | escape | | 111111 |

*Fig.14*

| LETTER | PROBABILITY OF OCCURRENCE | INTERVAL ON NUMBER LINE |
|---|---|---|
| A | 1/10 | [0.00,0.10) |
| C | 1/10 | [0.10,0.20) |
| E | 1/10 | [0.20,0.30) |
| H | 1/10 | [0.30,0.40) |
| I | 2/10 | [0.40,0.60) |
| M | 1/10 | [0.60,0.70) |
| R | 1/10 | [0.70,0.80) |
| T | 2/10 | [0.80,1.00) |

Fig.16

| CODE WORD | PROBABILITY TABLE | | | OUTPUT SIGNAL |
|---|---|---|---|---|
| | LOWER LIMIT | UPPER LIMIT | INTERVAL LENGTH | |
| 0.0757451536 | 0.0 | 0.1 | 0.1 | A |
| 0.757451536 | 0.7 | 0.8 | 0.1 | R |
| 0.57451536 | 0.4 | 0.6 | 0.2 | I |
| 0.8725768 | 0.8 | 1.0 | 0.2 | T |
| 0.362884 | 0.3 | 0.4 | 0.1 | H |
| 0.62884 | 0.6 | 0.7 | 0.1 | M |
| 0.2884 | 0.2 | 0.3 | 0.1 | E |
| 0.884 | 0.8 | 1.0 | 0.2 | T |
| 0.42 | 0.4 | 0.6 | 0.2 | I |
| 0.1 | 0.1 | 0.2 | 0.1 | C |

Fig.17

|  | CIF | | QCIF | |
|---|---|---|---|---|
| BIN No. | INITIAL VALUE OF 0 | INITIAL VALUE OF 1 | INITIAL VALUE OF 0 | INITIAL VALUE OF 1 |
| 0 | 2 | 5 | 4 | 1 |
| 1 | 3 | 5 | 2 | 3 |
| 2 | 1 | 1 | 1 | 1 |
| . | . | . | . | . |
| . | . | . | . | . |
| . | . | . | . | . |

Fig.18

| No. | ADJUSTMENT VALUE OF 0 | ADJUSTMENT VALUE OF 1 | CODE |
|---|---|---|---|
| 0 | 0 | 0 | 00 |
| 1 | 1 | 0 | 01 |
| 2 | 0 | -1 | 100 |
| 3 | -1 | 0 | 101 |
| 4 | 2 | 0 | 1100 |
| 5 | 0 | 2 | 1101 |
| . | . | . | . |
| . | . | . | . |
| . | . | . | . |

Fig.19

| BIN No. | CIF | | | | | | QCIF | | | | | |
|---|---|---|---|---|---|---|---|---|---|---|---|---|
| | 0 (LARGE MOTION) | | 1 (INTERMEDIATE MOTION) | | 2 (SMALL MOTION) | | 0 (LARGE MOTION) | | 1 (INTERMEDIATE MOTION) | | 2 (SMALL MOTION) | |
| | INITIAL VALUE OF 0 | INITIAL VALUE OF 1 | INITIAL VALUE OF 0 | INITIAL VALUE OF 1 | INITIAL VALUE OF 0 | INITIAL VALUE OF 1 | INITIAL VALUE OF 0 | INITIAL VALUE OF 1 | INITIAL VALUE OF 0 | INITIAL VALUE OF 1 | INITIAL VALUE OF 0 | INITIAL VALUE OF 1 |
| 0 | 1 | 8 | 2 | 5 | 4 | 1 | 2 | 5 | 4 | 1 | 6 | 1 |
| 1 | 2 | 5 | 2 | 3 | 3 | 5 | 2 | 3 | 3 | 5 | 4 | 3 |
| 2 | 1 | 1 | 1 | 1 | 1 | 1 | 1 | 1 | 1 | 1 | 1 | 1 |
| . | . | . | . | . | . | . | . | . | . | . | . | . |
| . | . | . | . | . | . | . | . | . | . | . | . | . |
| . | . | . | . | . | . | . | . | . | . | . | . | . |

Fig.20

| # | LSZ | NM | NL | SW | # | LSZ | NM | NL | SW | # | LSZ | NM | NL | SW |
|---|-----|----|----|----|----|----|----|----|----|----|----|----|----|----|
| 0 | 5601 | 1 | 1 | 1 | 16 | 5101 | 17 | 15 | 0 | 32 | 8A1 | 33 | 30 | 0 |
| 1 | 3401 | 2 | 6 | 0 | 17 | 4801 | 18 | 16 | 0 | 33 | 521 | 34 | 31 | 0 |
| 2 | 1801 | 3 | 9 | 0 | 18 | 3801 | 19 | 17 | 0 | 34 | 441 | 35 | 32 | 0 |
| 3 | AC1 | 4 | 12 | 0 | 19 | 3401 | 20 | 18 | 0 | 35 | 2A1 | 36 | 33 | 0 |
| 4 | 521 | 5 | 29 | 0 | 20 | 3001 | 21 | 19 | 0 | 36 | 221 | 37 | 34 | 0 |
| 5 | 221 | 38 | 33 | 0 | 21 | 2801 | 22 | 19 | 0 | 37 | 141 | 38 | 35 | 0 |
| 6 | 5601 | 7 | 6 | 1 | 22 | 2401 | 23 | 20 | 1 | 38 | 111 | 39 | 36 | 0 |
| 7 | 5401 | 8 | 14 | 0 | 23 | 2201 | 24 | 21 | 0 | 39 | 85 | 40 | 37 | 0 |
| 8 | 4801 | 9 | 14 | 0 | 24 | 1C01 | 25 | 22 | 0 | 40 | 49 | 41 | 38 | 0 |
| 9 | 3801 | 10 | 14 | 0 | 25 | 1801 | 26 | 23 | 0 | 41 | 25 | 42 | 39 | 0 |
| 10 | 3001 | 11 | 17 | 0 | 26 | 1601 | 27 | 24 | 0 | 42 | 15 | 43 | 40 | 0 |
| 11 | 2401 | 12 | 18 | 0 | 27 | 1401 | 28 | 25 | 0 | 43 | 9 | 44 | 41 | 0 |
| 12 | 1C01 | 13 | 20 | 0 | 28 | 1201 | 29 | 26 | 0 | 44 | 5 | 45 | 42 | 0 |
| 13 | 1601 | 29 | 21 | 0 | 29 | 1101 | 30 | 27 | 0 | 45 | 1 | 45 | 43 | 0 |
| 14 | 5601 | 15 | 14 | 1 | 30 | AC1 | 31 | 28 | 1 | | | | | |
| 15 | 5401 | 16 | 14 | 0 | 31 | 9C1 | 32 | 29 | 0 | | | | | |

Fig.21

| BIN No. | CIF | | QCIF | |
| --- | --- | --- | --- | --- |
| | INITIAL START POSITION | MORE PROBABLE SYMBOL | INITIAL START POSITION | MORE PROBABLE SYMBOL |
| 0 | 30 | 1 | 35 | 0 |
| 1 | 20 | 1 | 25 | 1 |
| 2 | 0 | 0 | 0 | 0 |
| . | . | . | . | . |
| . | . | . | . | . |
| . | . | . | . | . |

Fig.22

| No. | TRANSITION VALUE | DIRECTION | CODE |
| --- | --- | --- | --- |
| 0 | 0 | — | 0 |
| 1 | 1 | 0 | 100 |
| 2 | -1 | 1 | 101 |
| 3 | 2 | 0 | 1100 |
| 4 | -2 | 1 | 1101 |
| 5 | 3 | 0 | 11100 |
| . | . | . | . |
| . | . | . | . |
| . | . | . | . |

SIGNAL ENCODING METHOD, SIGNAL DECODING METHOD, SIGNAL ENCODING APPARATUS, SIGNAL DECODING APPARATUS, SIGNAL ENCODING PROGRAM, AND SIGNAL DECODING PROGRAM

RELATED APPLICATIONS

This application is a continuing application of PCT Application No. PCT/JP03/05401 filed on Apr. 25, 2003, designating U.S.A. and now pending.

BACKGROUND OF THE INVENTION

1. Field of the Invention

The present invention relates to a signal encoding method, a signal decoding method, a signal encoding apparatus, a signal decoding apparatus, a signal encoding program, and a signal decoding program suitably applicable to image transmission systems such as mobile video transmission systems.

2. Related Background of the Invention

The conventionally known methods of encoding moving pictures include International Standards of video coding such as the ITU-T H.26x series, the ISO/IEC MPEG series, and so on. These video coding methods are configured to process each of images of macroblocks obtained by dividing a frame image, by predetermined data transformation operations including Motion Compensation (MC) and Discrete Cosine Transform (DCT), so as to create image data as an object of coding.

The image data created by the data transformation operations is further subjected to entropy coding to obtain encoded data which is compressed data used in picture transmission. Arithmetic Coding (AC) is used as one of such entropy coding methods. The arithmetic coding will be outlined below, but reference should be made as to the details of the arithmetic coding to "The Data Compression Book" authored by M. Nelson and J. -L. Gailley and translated by Takeshi Ogiwara and Suguru Yamaguchi, and others.

In general, where the arithmetic coding is effected on an information source sequence (symbol sequence) as a combination of plural types of symbols, the symbols are first assigned respective fixed intervals according to probabilities of occurrence of the symbols, on a number line (probability number line) of [0.0, 1.0). At this time, a table indicating the correspondence between the symbols and the intervals on the number line is called a probability table. The information source sequence is entropy coded by the arithmetic coding with reference to this probability table, so as to create a code word as an expression of the information source sequence on the number line.

Let us explain the arithmetic coding herein with reference to FIGS. 14–16. Specifically, the arithmetic coding will be explained with an example in which a character string "ARITHMETIC" is an information source sequence as an object of coding and is encoded by the arithmetic coding.

There appear eight types of characters (symbols) of A, C, E, H, I, M, R, and T in the above information source sequence. These letters are assigned respective intervals on the number line (probability number line) of [0.0, 1.0), as shown in the table of FIG. 14, so that the intervals have respective lengths proportional to probabilities of occurrence of the respective letters in the letter string. The table shown in FIG. 14 to illustrate the correspondence between the letters and the intervals on the number line is the probability table used in the arithmetic coding.

FIG. 15 is a diagram showing the coding of the letter string "ARITHMETIC" through the use of the probability table shown in FIG. 14. In the arithmetic coding, interval reduction operations based on the probability table are successively carried out for the respective symbols in the information source sequence, so as to generate a code word as encoded data of the information source sequence.

In the example shown in FIG. 15, for the first letter "A" in the character string "ARITHMETIC" as an object of coding, the interval [0, 1) on the number line is first divided into eight intervals corresponding to the respective letters with reference to the probability table shown in FIG. 14. Then the interval is reduced to the interval [0.0, 0.1) corresponding to the letter "A" among those intervals. Next, for the second letter "R," the interval [0.0, 0.1) is divided into eight intervals. Then the interval is reduced to the interval [0.07, 0.08) corresponding to the letter "R" among those intervals.

Thereafter, coding operations by this interval reduction are successively carried out for the respective letters. Then we finally obtain the interval [0.0757451536, 0.0757451552) on the number line and the number "0.0757451536" in the interval is generated as a code word as a result of the arithmetic coding of the letter string "ARITHMETIC."

FIG. 16 is a diagram showing the decoding of the code word "0.0757451536" into the letter string "ARITHMETIC" with the probability table shown in FIG. 14.

In the example shown in FIG. 16, the interval [0.0, 0.1) of the interval length 0.1 including the code word is first identified from the code word "0.0757451536" as an object of decoding, with reference to the probability table shown in FIG. 14. Then the letter "A" corresponding to the identified interval is outputted as the first letter and a new code word "0.757451536" is generated according to (code word-lower limit)/(interval length). Then, from the code word "0.757451536," the interval [0.7, 0.8) of the interval length 0.1 including the code word is identified with reference to the probability table. The letter "R" corresponding to the identified interval is outputted as the second letter and a new code word "0.57451536" is generated.

Thereafter, such decoding operations are successively carried out for the code word. It results in restoring the letter string "ARITHMETIC" from the arithmetic coded data of the code word "0.0757451536."

As described above, the entropy coding of the information source sequence by the arithmetic coding involves making the correspondence between symbols in the information source sequence and intervals on the number line, whereby it can express any information source sequence by a code word on the number line of [0.0, 1.0]. By setting the probability table providing the correspondence between symbols and intervals according to probabilities of occurrence of respective symbols, it is feasible to efficiently carry out the entropy coding of the information source sequence and thereby increase the efficiency of data compression by coding.

SUMMARY OF THE INVENTION

FIG. 5 is a flowchart showing an example of the video coding method using the entropy coding by the arithmetic coding as described above. In the image coding method shown in FIG. 5, the arithmetic coding of image data is carried out by the method called CABAC (Context-based Adaptive Binary Arithmetic Coding) using the context modeling adopted in the ITU-T H.26L video coding method. Concerning the details of the ITU-T H.26L video coding method and CABAC, reference should be made to VCEG-M10 H.26L Test Model Long Term Number 8 (TML-8) draft0.

In coding of moving picture data in the H.26L video coding method, an image as an object of coding is first divided into image blocks of predetermined size. The image blocks are image blocks as units of data processing, which are called macroblocks. Each macroblock is subjected to the necessary data transformation operations including Intra-Frame Coding (coding within a frame) or Inter-Frame Coding (coding between frames), an orthogonal transformation such as DCT, etc. to generate image data representing an image within the macroblock. Then the image data is subjected to the entropy coding by the arithmetic coding to generate encoded data as compressed data.

In the video coding method shown in FIG. 5, particularly, the coding is not carried out under a preliminarily fixed condition, but the context modeling is implemented in the coding of image data in each macroblock (step S901, Context Modeling). The arithmetic coding using the context modeling is arranged as to the probability table used in coding of image data so that the probability table applied to image data of a macroblock as an object of coding is set as switched with reference to a coding condition such as the processing result of image coding in an adjacent macroblock.

After completion of the setting of the probability table by the context modeling, the image data as an object of coding (e.g., DCT coefficients) is binarized to generate a data sequence to be arithmetic coded (S902, Binarization). Then the binarized data sequence is arithmetic coded (S903, Adaptive Binary Arithmetic Coding) to obtain encoded data.

Specifically, each of bits in the binarized data sequence is subjected to probability estimation with allocation of the probability table set by the context modeling (S904, Probability Estimation). Then the data sequence is arithmetic coded with the probability table allocated, to generate a code word on the number line as encoded data (S905, Arithmetic Coding). The probability evaluation is updated by feeding information such as frequencies of occurrence of encoded bits back to the probability table, based on the processing result of the arithmetic coding, to make the probability table reflect the tendency of coding (S906, Probability Estimation Update).

According to the above video coding method by the arithmetic coding using the context modeling, the probability table used is switched according to the coding condition and processing result, whereby it is feasible to reduce the redundancy in the encoded data.

In the case of encoded data resulting from coding of a frame image, for a frame layer corresponding to the frame image, there are cases where the frame layer is divided into one or two or more slices in a slice layer and encoded data is generated from each slice. The slice layer is configured so as to permit independent decoding in each slice unit, and it is provided with a synchronization code, and packetized to be transmitted. Therefore, even if an error occurs during transmission of a certain slice to cause data loss, the decoding can be restarted for the subsequent slices.

The probability table applied to the arithmetic coding is initialized in each slice. The initialization of the probability table has effects including the effect of enabling decoding of arithmetic coding information disabled by occurrence of error, as well as the recovery of synchronization discussed above.

The values in the probability table used for the initialization are normally average constant values, independent of moving pictures as objects of coding. For this reason, the values are sometimes inappropriate as initial values of the probability table for some images of coding objects, because the properties thereof greatly deviate from those of the average images. In such cases, CABAC is arranged to update the probability table on the basis of rates of occurrence of symbols in a coding target signal with progress of coding. This enables learning toward the probability table suitable for the properties of images, so that the arithmetic coding can effectively be carried out with the appropriate probability table eventually. However, the arithmetic coding is not carried out efficiently on the way of the learning before adequate update of the probability table. Particularly, where a probability table is at low use and thus is not updated well, the learning of the probability table is inadequate, and it is thus difficult to perform efficient coding. Since the probability table is initialized in units of partitions, it is necessary to implement learning of the probability table in units of partitions. For this reason, a lot of learning periods as described above regularly appear during transmission, which makes the coding inefficient.

An object of the present invention is, therefore, to solve the above problem and thereby provide a signal encoding method, a signal encoding apparatus, and a signal encoding program capable of implementing efficient coding, and a signal decoding method, a signal decoding apparatus, and a signal decoding program capable of implementing efficient decoding of an encoded signal.

In order to achieve the above object, a signal encoding method according to the present invention is a signal encoding method of dividing a coding target signal as an object of coding into partition units and performing arithmetic coding based on probability-related information initialized at the head of the partition units, the signal encoding method comprising: (1) a configuration information deriving step of analyzing the coding target signal in each of the partition units to derive an initial value of the probability-related information used in the arithmetic coding of the coding target signal in the partition unit in question, and converting the initial value of the probability-related information into previous information separately attached to a header for the coding target signal and an adjustment value to be combined with the previous information by a predetermined method, to derive the adjustment value as configuration information; (2) a coding step of performing the arithmetic coding of the coding target signal in each of the partition units, based on the configuration information and the previous information; and (3) a configuration information adding step of adding the header containing the configuration information and the previous information to the arithmetic-coded signal in each of the partition units.

Likewise, a signal encoding apparatus according to the present invention is a signal encoding apparatus for dividing a coding target signal as an object of coding into partition units and performing arithmetic coding based on probability-related information initialized at the head of the partition units, the signal encoding apparatus comprising: (1) configuration information deriving means for analyzing the coding target signal in each of the partition units to derive an initial value of the probability-related information used in the arithmetic coding of the coding target signal in the partition unit in question, and converting the initial value of the probability-related information into previous information separately attached to a header for the coding target signal and an adjustment value to be combined with the previous information by a predetermined method, to derive the adjustment value as configuration information; (2) coding means for performing the arithmetic coding of the coding target signal in each of the partition units, based on the configuration information derived in the above configuration information deriving step and the previous information; and (3) configuration information adding means for adding the header containing the configuration information and the previous information to the arithmetic-coded signal in each of the partition units.

Similarly, a signal encoding program according to the present invention is a signal encoding program for dividing a coding target signal as an object of coding into partition units and performing arithmetic coding based on probability-related information initialized at the head of the partition units, the signal encoding program letting a computer execute: (1) a configuration information deriving step of analyzing the coding target signal in each of the partition units to derive an initial value of the probability-related information used in the arithmetic coding of the coding target signal in the partition unit in question, and converting the initial value of the probability-related information into previous information separately attached to a header for the coding target signal and an adjustment value to be combined with the previous information by a predetermined method, to derive the adjustment value as configuration information; (2) a coding step of performing the arithmetic coding of the coding target signal in each of the partition units, based on the configuration information and the previous information; and (3) a configuration information adding step of adding the header containing the configuration information and the previous information to the arithmetic-coded signal in each of the partition units.

According to these aspects of the invention, the header contains the foregoing previous information and configuration information for deriving the initial value of the probability-related information in each partition unit, whereby it is feasible to perform the coding using the initial values of the probability-related information different among the partition units. Since the configuration information used in each partition unit is derived by analyzing the coding target signal in each of the partition units, the configuration information capable of achieving efficient coding can be used according to the coding target signal in each partition unit.

A signal decoding method according to the present invention is a signal decoding method of performing arithmetic decoding of a coded signal in partition units, the signal decoding method comprising: (1) an initial value setting step of setting an initial value of probability-related information, based on previous information in a header of the coded signal and based on configuration information included in the header of the coded signal, which is information for deriving the initial value of the probability-related information used in the arithmetic decoding of the coded target signal in the partition unit by being combined with the previous information by a predetermined method; and (2) an arithmetic decoding step of performing the arithmetic decoding of the coded signal in each of the partition units on the basis of the probability-related information the initial value of which was set in the initial value setting step.

A signal decoding apparatus according to the present invention is a signal decoding apparatus for performing arithmetic decoding of a coded signal in partition units, the signal decoding apparatus comprising: (1) initial value setting means for setting an initial value of probability-related information, based on previous information in a header of the coded signal and based on configuration information included in the header of the coded signal, which is information for deriving the initial value of the probability-related information used in the arithmetic decoding of the coded target signal in the partition unit by being combined with the previous information by a predetermined method; and (2) arithmetic decoding means for performing the arithmetic decoding of the coded signal in each of the partition units on the basis of the probability-related information the initial value of which was set in the initial value setting means.

A signal decoding program according to the present invention is a signal decoding program for performing arithmetic decoding of a coded signal in partition units, the signal decoding program letting a computer execute: (1) an initial value setting step of setting an initial value of probability-related information, based on previous information in a header of the coded signal and based on configuration information included in the header of the coded signal, which is information for deriving the initial value of the probability-related information used in the arithmetic decoding of the coded target signal in the partition unit by being combined with the previous information by a predetermined method; and (2) an arithmetic decoding step of performing the arithmetic decoding of the coded signal in each of the partition units on the basis of the probability-related information the initial value of which were set in the initial value setting step.

The initial values of the probability-related information are set on the basis of the above previous information and configuration information in the header and the arithmetic decoding of the coded signal is carried out in each partition unit on the basis of the initial values thus set, as described above, whereby it is feasible to decode the coded signal by the configuration information in each partition unit.

In order to achieve the above object, another signal encoding method according to the present invention is a signal encoding method of dividing a coding target signal as an object of coding into partitions and performing arithmetic coding of the coding target signal in each of the partitions, using a state transition diagram in which each of state numbers is related to probability-related information, the signal encoding method comprising: (1) a configuration information deriving step of analyzing the coding target signal in each of the partition units to derive an initial value of the probability-related information used in the arithmetic coding of the coding target signal in the partition unit in question, and converting a state number related to the initial value of the probability-related information, into a value derived based on previous information separately attached to a header for the coding target signal and an adjustment value to be combined with the mentioned value by a predetermined method, to derive the adjustment value as configuration information; (2) a coding step of performing the arithmetic coding of the coding target signal in each of the partition units, based on the initial value of the probability-related information derived in the configuration information deriving step; and (3) a configuration information adding step of adding the header containing the previous information and the configuration information to the arithmetic-coded signal in each of the partition units.

Similarly, another signal encoding apparatus according to the present invention is a signal encoding apparatus for dividing a coding target signal as an object of coding into partitions and performing arithmetic coding of the coding target signal in each of the partitions, using a state transition diagram in which each of state numbers is related to probability-related information, the signal encoding apparatus comprising: (1) configuration information deriving means for analyzing the coding target signal in each of the partition units to derive an initial value of the probability-related information used in the arithmetic coding of the coding target signal in the partition unit in question, and converting a state number related to the initial value of the probability-related information, into a value derived based on previous information separately attached to a header for the coding target signal and an adjustment value to be combined with the mentioned value by a predetermined method, to derive the adjustment value as configuration information; (2) coding means for performing the arithmetic coding of the coding target signal in each of the partition units, based on the initial value of the probability-related information derived in the configuration information deriving means; and (3) configuration information adding means for adding the header containing the previous information and the configuration information to the arithmetic-coded signal in each of the partition units.

Likewise, another signal encoding program according to the present invention is a signal encoding program for dividing a coding target signal as an object of coding into partitions and performing arithmetic coding of the coding target signal in each of the partitions, using a state transition diagram in which each of state numbers is related to probability-related information, the signal encoding program letting a computer execute: (1) a configuration information deriving step of analyzing the coding target signal in each of the partition units to derive an initial value of the probability-related information used in the arithmetic coding of the coding target signal in the partition unit in question, and converting a state number related to the initial value of the probability-related information, into a value derived based on previous information separately attached to a header for the coding target signal and an adjustment value to be combined with the mentioned value by a predetermined method, to derive the adjustment value as configuration information; (2) a coding step of performing the arithmetic coding of the coding target signal in each of the partition units, based on the initial value of the probability-related information derived in the configuration information deriving step; and (3) a configuration information adding step of adding the header containing the previous information and the configuration information to the arithmetic-coded signal in each of the partition units.

According to these aspects of the invention, the header contains the foregoing previous information and configuration information for deriving the initial state number associated with the initial value of the probability-related information used in the arithmetic coding of the coding target signal in each partition unit, whereby it is feasible to perform the coding using the initial values of the probability-related information different among the partition units. Since the configuration information used in each partition unit is derived by analyzing the coding target signal in each of the partition units, the configuration information capable of achieving efficient coding can be used according to the coding target signal in each partition unit.

Another signal decoding method according to the present invention is a signal decoding method of performing arithmetic decoding of a coded signal in partition units, using a state transition diagram in which each of state numbers is related to probability-related information, the signal decoding method comprising: (1) an initial value setting step of deriving an initial state number, based on previous information and configuration information to be combined with the previous information, included in a header of the coded signal in order to derive by a predetermined method the initial state number related to the initial value of the probability-related information used in the arithmetic decoding of the coded target signal in the partition unit; and (2) an arithmetic decoding step of performing the arithmetic decoding of the coded signal on the basis of the probability-related information related to the initial state number.

Another signal decoding apparatus according to the present invention is a signal decoding apparatus for performing arithmetic decoding of a coded signal in partition units, using a state transition diagram in which each of state numbers is related to probability-related information, the signal decoding apparatus comprising: (1) initial value setting means for deriving an initial state number, based on previous information and configuration information to be combined with the previous information, included in a header of the coded signal in order to derive by a predetermined method the initial state number related to the initial value of the probability-related information used in the arithmetic decoding of the coded target signal in the partition unit; and (2) arithmetic decoding means for performing the arithmetic decoding of the coded signal on the basis of the probability-related information related to the initial state number.

Another signal decoding program according to the present invention is a signal decoding program for performing arithmetic decoding of a coded signal in partition units, using a state transition diagram in which each of state numbers is related to probability-related information, the signal decoding program letting a computer execute: (1) an initial value setting step of deriving an initial state number, based on previous information and configuration information to be combined with the previous information, included in a header of the coded signal in order to derive by a predetermined method the initial state number related to the initial value of the probability-related information used in the arithmetic decoding of the coded target signal in the partition unit; and (2) an arithmetic decoding step of performing the arithmetic decoding of the coded signal on the basis of the probability-related information related to the initial state number.

As described above, the initial state number associated with the initial value of the probability-related information can be derived based on the foregoing previous information and configuration information in the header and the arithmetic decoding of the coded signal is carried out in each partition unit through the use of the probability-related information associated with the initial state number, whereby it is feasible to decode the coded signal by the configuration information in each partition unit.

Still another signal encoding method according to the present invention is a signal encoding method of dividing a coding target signal as an object of coding into partition units and performing arithmetic coding based on probability-related information initialized at the head of the partition units, the signal encoding method comprising: (1) a configuration information deriving step of analyzing the coding target signal in each of the partition units to derive as configuration information, information about an initial value for initialization of the probability-related information used in the arithmetic coding of the coding target signal in the partition unit in question; (2) a coding step of performing the arithmetic coding of the coding target signal in each of the partition units, based on the configuration information; and (3) a configuration information adding step of adding a header containing the configuration information to the arithmetic-coded signal in each of the partition units; wherein the configuration information deriving step is configured to derive the configuration information by combining the initial values of the probability-related information derived by analyzing the coding target signal, with information separately attached as previous information of the coding target signal to the header, by a predetermined method.

According to this aspect of the invention, the header contains the foregoing previous information and configuration information for deriving the initial value of the probability-related information in each partition unit, whereby it is feasible to perform the coding using the initial values of the probability-related information different among partition units. Since the configuration information used in each partition unit is derived by analyzing the coding target signal in each partition unit, the configuration information capable of achieving efficient coding can be used according to the coding target signal in each partition unit.

Still another signal decoding method according to the present invention is a signal decoding method of performing arithmetic decoding of a coded signal in partition units, the signal decoding method comprising: (1) an initial value setting step of setting an initial value of probability-related information on the basis of configuration information which is information about the initial value for initialization of the probability-related information used in the arithmetic decoding of the coded target signal in the partition unit and which is included in a header attached to the coded signal; and (2) an arithmetic decoding step of performing the arithmetic decoding of the coded signal in each of the partition units on the basis of the probability-related information the initial value of which was set in the initial value setting step; wherein the initial value setting step is configured to set the initial values of the probability-related information by combining the configuration information in the header attached to the coded signal, with previous information in the header of the coded signal by a predetermined method.

As described above, the initial value of the probability-related information are set based on the foregoing previous information and configuration information in the header and the arithmetic decoding of the encoded signal is carried out in each partition unit on the basis of the initial values thus set, whereby it is feasible to decode the coded signal by the configuration information in each partition unit.

In order to achieve the above object, still another signal encoding method according to the present invention is a signal encoding method of dividing a coding target signal as an object of coding into partition units and performing arithmetic coding based on probability-related information initialized at the head of the partition units, the signal encoding method comprising: (1) a configuration information deriving step of analyzing the coding target signal in each of the partition units to derive as configuration information, information about an initial value for initialization of the probability-related information used in the arithmetic coding of the coding target signal in the partition unit in question; (2) a coding step of performing the arithmetic coding of the coding target signal in each of the partition units, based on the configuration information derived in the configuration information deriving step; and (3) a configuration information adding step of adding a header containing the configuration information to the arithmetic-coded signal in each of the partition units.

Likewise, still another signal encoding apparatus according to the present invention is a signal encoding apparatus for dividing a coding target signal as an object of coding into partition units and performing arithmetic coding based on probability-related information initialized at the head of the partition units, the signal encoding apparatus comprising: (1) configuration information deriving means for analyzing the coding target signal in each of the partition units to derive as configuration information, information about an initial value for initialization of the probability-related information used in the arithmetic coding of the coding target signal in the partition unit in question; (2) coding means for performing the arithmetic coding of the coding target signal in each of the partition units, based on the configuration information derived by the configuration information deriving means; and (3) configuration information adding means for adding a header containing the configuration information to the arithmetic-coded signal in each of the partition units.

In the signal encoding method and apparatus according to the present invention, as described above, the header of the coded signal contains the configuration information used in the coding in each partition unit, whereby it is feasible to perform the coding using the initial values of the probability-related information (configuration information) different among the partition units. Since the configuration information used in each partition unit is the one obtained by analyzing the coding target signal in each partition unit and deriving the configuration information used for the arithmetic coding, the configuration information capable of achieving efficient coding can be used according to the coding target signal in each partition unit.

Still another signal decoding method according to the present invention is a signal decoding method of performing arithmetic decoding of a coded signal in partition units, the signal decoding method comprising: an initial value setting step of setting an initial value of probability-related information on the basis of configuration information included in a header attached to the coded signal; and an arithmetic decoding step of performing the arithmetic decoding of the coded signal in each of the partition units on the basis of the probability-related information the initial value of which was set in the initial value setting step.

Similarly, still another signal decoding apparatus according to the present invention is a signal decoding apparatus for performing arithmetic decoding of a coded signal in partition units, the signal decoding apparatus comprising: initial value setting means for setting an initial value of probability-related information on the basis of configuration information included in a header attached to the coded signal; and arithmetic decoding means for performing the arithmetic decoding of the coded signal in each of the partition units on the basis of the probability-related information the initial value of which was set by the initial value setting means.

As described above, the initial value of the probability-related information is set on the basis of the configuration information included in the header and the arithmetic decoding of the coded signal is carried out in each partition unit on the basis of the initial value thus set, whereby it is feasible to decode the coded signal by the configuration information in each partition unit.

In the above signal encoding method (signal encoding apparatus), preferably, the configuration information deriving step (configuration information deriving means) is configured to define the initial value of the probability-related information itself as In the above signal decoding method (signal decoding apparatus), preferably, the initial value setting step (initial value setting means) is configured to set the configuration information included in the header as the initial values.

The above signal encoding method (signal encoding apparatus) may be arranged so that the configuration information deriving step (configuration information deriving means) is configured to define as the configuration information, differences of the initial value of the probability-related information derived by analyzing the coding target signal, from a predetermined value.

The above signal decoding method (signal decoding apparatus) may be arranged so that the initial value setting step is configured to set as the initial value, a value obtained by adding a predetermined value to the configuration information in the header.

This configuration is preferable, because the volume of the configuration information becomes lower by defining as the configuration information the differences between the predetermined value and the initial value.

The above signal encoding method (signal encoding apparatus) may be arranged to comprise preparing a list in which candidates for the configuration information are associated with identifiers, and arranged so that the configuration information adding step (configuration information adding means) is configured to select a candidate corresponding to the configuration information derived in the configuration information deriving step, from in the list and put an identifier associated therewith, as the configuration information into the header.

The above signal decoding method (signal decoding apparatus) may be arranged to comprise preparing a list in which candidates for the configuration information are associated with identifiers, and arranged so that the header contains an identifier of a candidate selected as the configuration information from in the list, and so that the initial value setting step (initial value setting means) is configured to extract the configuration information from the list on the basis of the identifier in the header and set the initial value of the probability-related information on the basis of the extracted configuration information.

As described above, an identifier in the list prepared in advance is added as the configuration information to the header, whereby it is feasible to decrease the volume of signal transmission.

The above signal encoding method (signal encoding apparatus) may be arranged so that, where the list contains no candidate for the configuration information derived in the configuration information deriving step (or derived by the configuration information deriving means), the configuration information adding step (configuration information adding means) is configured to put into the header an identifier indicating identification information except for the candidates stored in the list, along with the configuration information derived in the configuration information deriving step (or derived by the configuration information deriving means).

The above signal decoding method (signal decoding apparatus) may be arranged so that, where the identifier in the header is absent in the list, the initial value setting step (initial value setting means) is configured to set the initial value of the probability-related information on the basis of the configuration information in the header.

When the header is allowed to contain as the configuration information the initial value absent in the list prepared in advance, as described above, it is feasible to increase degrees of freedom for the initial values of the probability-related information.

The above signal encoding method (signal encoding apparatus) may be configured so that in the coding step (by the coding means), on the occasion of coding the coding target signal, the probability-related information is sequentially calculated on the basis of rates of occurrence of respective symbols in the coding target signal and the arithmetic coding of the coding target signal is carried out based on the calculated probability-related information.

The above signal decoding method (signal decoding apparatus) may be configured so that in the arithmetic decoding step (by the arithmetic decoding means), on the occasion of performing the arithmetic decoding of the coded signal, the probability-related information is sequentially calculated on the basis of rates of occurrence of respective symbols in the coded signal and the arithmetic decoding of the coded target signal is carried out based on the calculated probability-related information.

The probability-related information is updated on the basis of the rates of occurrence of symbols in the coding target signal, as described above, whereby it is feasible to perform the learning toward more appropriate probability-related information.

The above signal encoding method (signal encoding apparatus) may be arranged so that the configuration information deriving step (configuration information deriving means) is configured to analyze rates of occurrence of respective symbols in the coding target signal in the partition units and derive the configuration information on the basis of the rates of occurrence.

As described above, the symbols in the coding target information in each partition unit are compiled to analyze the rates of occurrence of the symbols and the configuration information is derived based on the rates of occurrence of the symbols, whereby it is feasible to obtain the appropriate initial values of the probability-related information for coding of the signal in the partition unit in question.

The above signal encoding method (signal encoding apparatus) may be arranged so that the header added in the configuration information adding step (or added by the configuration information adding means) contains a presence/absence flag indicating presence or absence of the configuration information, and so that, where the configuration information is the same as that used for coding of a previous partition unit, the configuration information adding step (means) is configured to set the presence/absence flag to absence and not to put the configuration information into the header.

The above signal decoding method (signal decoding apparatus) may be arranged so that the header contains a presence/absence flag indicating presence or absence of the configuration information, and so that the initial value setting step (initial value setting means) is configured to set the initial value of the probability-related information on the basis of the configuration information used for coding of a previous partition unit, when the presence/absence flag indicates absence.

When the coding can be performed using the same configuration information as that used for the coding of the previous partition unit, the presence/absence flag is set to absence, as described above, and this obviates the need for transmission of the same configuration information, which can decrease the volume of signal transmission.

In the above signal encoding method (signal encoding apparatus) or signal decoding method (signal decoding apparatus), preferably, the coding target signal is a video coding related signal obtained by effecting a predetermined data transformation operation on video information.

The above signal encoding method (signal encoding apparatus) may be arranged so that the video coding related signal is of a layered structure having a sequence layer partitioned by a sequence of video information to be coded, a frame layer partitioned by frames of the video information to be coded, and a slice layer resulting from partitioning of the frames each into one or more slices, and so that the configuration information adding step (configuration information adding means) is configured to put the configuration information into a header of a partition unit in either one of the sequence layer, the frame layer, and the slice layer.

The above signal decoding method (signal decoding apparatus) may be arranged so that the coded signal is of a layered structure having a sequence layer partitioned by a sequence of the video information coded, a frame layer partitioned by frames of the video information coded, and a slice layer resulting from partitioning of the frames each into one or more slices, and so that the initial value setting step (initial value setting means) is configured to set the initial value of the probability-related information on the basis of the configuration information in a header of a partition unit in either one of the sequence layer, the frame layer, and the slice layer.

When the coding target signal is configured in the layered structure consisting of the sequence layer, frame layer, and slice layer as described above, it is feasible to implement efficient signal coding, by letting a header in either layer contain the configuration information. For example, where two or more slices below a certain frame are coded based on the same configuration information, the header of the frame is made to contain the configuration information, whereby the slices below the frame can be encoded by the same configuration information.

The above signal encoding method (signal encoding apparatus) may be arranged so that the video coding related signal is of a layered structure having a sequence layer partitioned by a sequence of video information to be coded, a frame layer partitioned by frames of the video information to be coded, and a slice layer resulting from partitioning of the frames each into one or more slices, and so that the configuration information adding step (configuration information adding means) is configured to put the configuration information into a header in the slice layer.

The above signal decoding method (signal decoding apparatus) may be arranged so that the coded signal is of a layered structure having a sequence layer partitioned by a sequence of video information coded, a frame layer partitioned by frames of the video information coded, and a slice layer resulting from partitioning of each frame into one or more slices, and so that the initial value setting step (initial value setting means) is configured to set the initial value of the probability-related information on the basis of the configuration information in a header in the slice layer.

By letting the header in the slice layer contain the configuration information in this way, it is feasible to finely set the initial values of the probability-related information and thereby perform efficient coding.

The above signal encoding method (signal encoding apparatus) may be arranged so that the configuration information is derived by combining the initial value of the probability-related information derived by analyzing the coding target signal, with the information separately attached as the previous information of the coding target signal to the header, by a predetermined method.

The above signal decoding method (signal decoding apparatus) may be arranged so that the initial value of the probability-related information is set by combining the configuration information in the header attached to the coded signal, with the previous information in the header of the coded signal by a predetermined method.

A signal transmission system according to the present invention is a signal transmission system for dividing a coding target signal as an object of coding into partitions, and implementing signal transmission of a coded signal resulting from arithmetic coding in each partition unit, which comprises the aforementioned signal encoding apparatus for generating and outputting the coded signal from the coding target signal, and the aforementioned signal decoding apparatus for receiving the coded signal from the signal encoding apparatus and decoding the coded signal thus received.

The signal transmission system of this configuration is able to transmit the signal efficiently coded in each partition unit.

BRIEF DESCRIPTION OF THE DRAWINGS

FIGS. 4A–4B are illustrations showing the orthogonal transform of image data;

FIG. 7 is a diagram showing an example of coding by UVLC;

FIGS. 12A to 12C are diagrams showing examples of initial value lists and code tables thereof.

FIG. 14 is a table showing an example of the probability table used in the arithmetic coding.

FIG. 16 is an illustration showing the decoding of the character string using the probability table shown in FIG. 14.

FIG. 17 is a diagram showing an example of determining the initial values from the header information.

FIG. 18 is a diagram showing an example of setting of initial values by the list described in the second embodiment.

FIG. 19 is a diagram showing an example of preparing a plurality of initial value lists using the previous information in the header and telling a code indicating a list used as the initial value configuration information.

FIG. 20 is a diagram showing an example of the probability state transition diagram.

FIG. 21 is a diagram showing an example in which the initial state of the state transition diagram about the arithmetic coding of motion vector is defined by making use of the screen size as a previous parameter.

FIG. 22 is a diagram showing an example of the configuration information.

DESCRIPTION OF THE PREFERRED EMBODIMENTS

Figure 1:
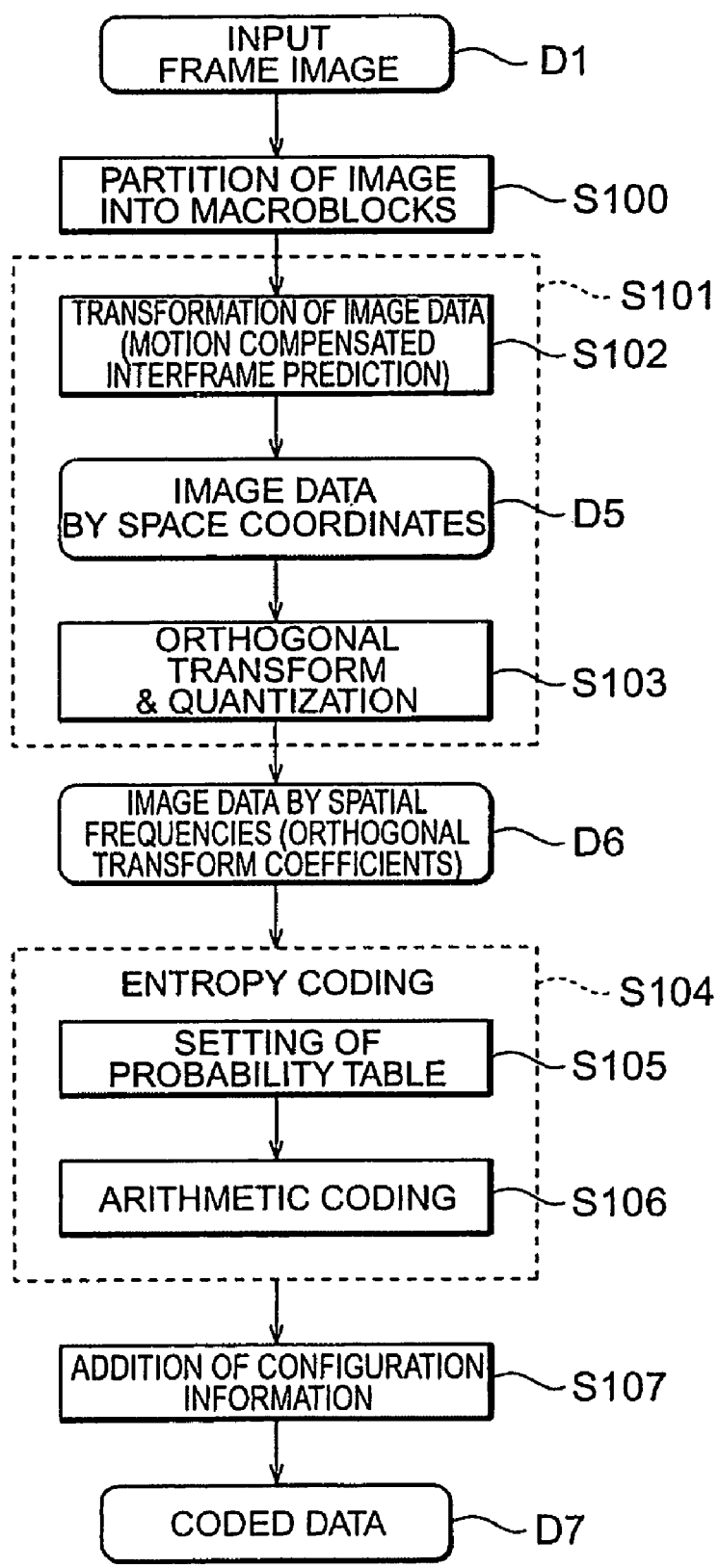
FIG. 1 is a flowchart schematically showing an embodiment of the image encoding method.

The preferred embodiments of the signal encoding method, signal decoding method, signal encoding apparatus, signal decoding apparatus, and signal transmission system using them according to the present invention will be described below in detail with reference to the drawings. The same elements will be denoted by the same reference symbols throughout the description of the drawings, without redundant description thereof. It is also noted that the dimensional ratios in the drawings do not always agree with those in the description.

First, the signal encoding method according to the present embodiment will be described. Described as an example herein is a video coding method of performing the arithmetic coding of a video coding related signal obtained by effecting the predetermined data transformation operations on a moving picture (video information).

FIG. 1 is a flowchart schematically showing the video encoding method according to the present embodiment. The encoding method is a video encoding method of subjecting an input frame image D1 of a frame image in a moving picture to predetermined data transformation operation and encoding operation to generate encoded data D7 as compressed data, which can be transmitted in the video transmission system.

First, the input frame image D1 is divided into macroblocks of predetermined size (predetermined number of pixels) (step S100), and an image of each macroblock in the frame image D1 is subjected to the predetermined data transformation operation to create image data D6 as an object of coding (S101, transformation step). In the present embodiment, this transformation step consists of two steps S102, S103.

Specifically, the frame image D1 is subjected to a predetermined data processing operation of conversion of image data to obtain image data (space image data) D5 expressed by space coordinates (step S102). The data processing operation executed herein can be, for example, the motion-compensated (MC: Motion Compensation) interframe prediction where the frame image in the moving picture is subjected to interframe coding (coding between frames). Where the frame image is subjected to intraframe coding (coding within the frame), for example, the image data of the input frame image D1 is used as space image data D5 as it is.

Next, the space image data D5 is subjected to the orthogonal transform operation to generate a plurality of orthogonal transform coefficients D6 which are image data expressed by spatial frequencies (frequency image data) (S103, orthogonal transform step). This orthogonal transform is carried out in each of the macroblocks obtained by dividing the frame image, and the orthogonal transform coefficients are obtained from each macroblock in the input frame image D1. These orthogonal transform coefficients are further subjected to a quantization operation according to necessity, to generate quantized orthogonal transform coefficients which are image data as an object of entropy coding.

Subsequently, the entropy coding by the arithmetic coding is carried out with the plurality of orthogonal transform coefficients D6 to generate coded data D7 as compressed data (S104, coding step). Namely, a predetermined probability table is set as a probability table (probability-related information) applied to the quantized orthogonal transform coefficients D6 (S105).

The coded data D7 herein has the layered structure consisting of the slice layer, the frame layer, and the sequence layer. The slice layer is a layer consisting of a plurality of macroblocks, the frame layer a layer consisting of one or more slice layers and corresponding to a frame image, and the sequence layer a layer corresponding to the entire coded data. The initial values in the probability table used for the entropy coding are determined so as to be able to efficiently encode the data of each slice layer, and this method will be described later. Then the quantized orthogonal transform coefficients D6 are arithmetic coded through the use of the set probability table (S106) to obtain coded data D7. Thereafter, the initial values of the probability table used for the generation of the coded data are added as configuration information to the header of the coded data (S107). Also added together at S107 is a condition for coding of the entire image or the entire slice, e.g., information indicating either the intraframe coding or the interframe coding.

Figure 2:
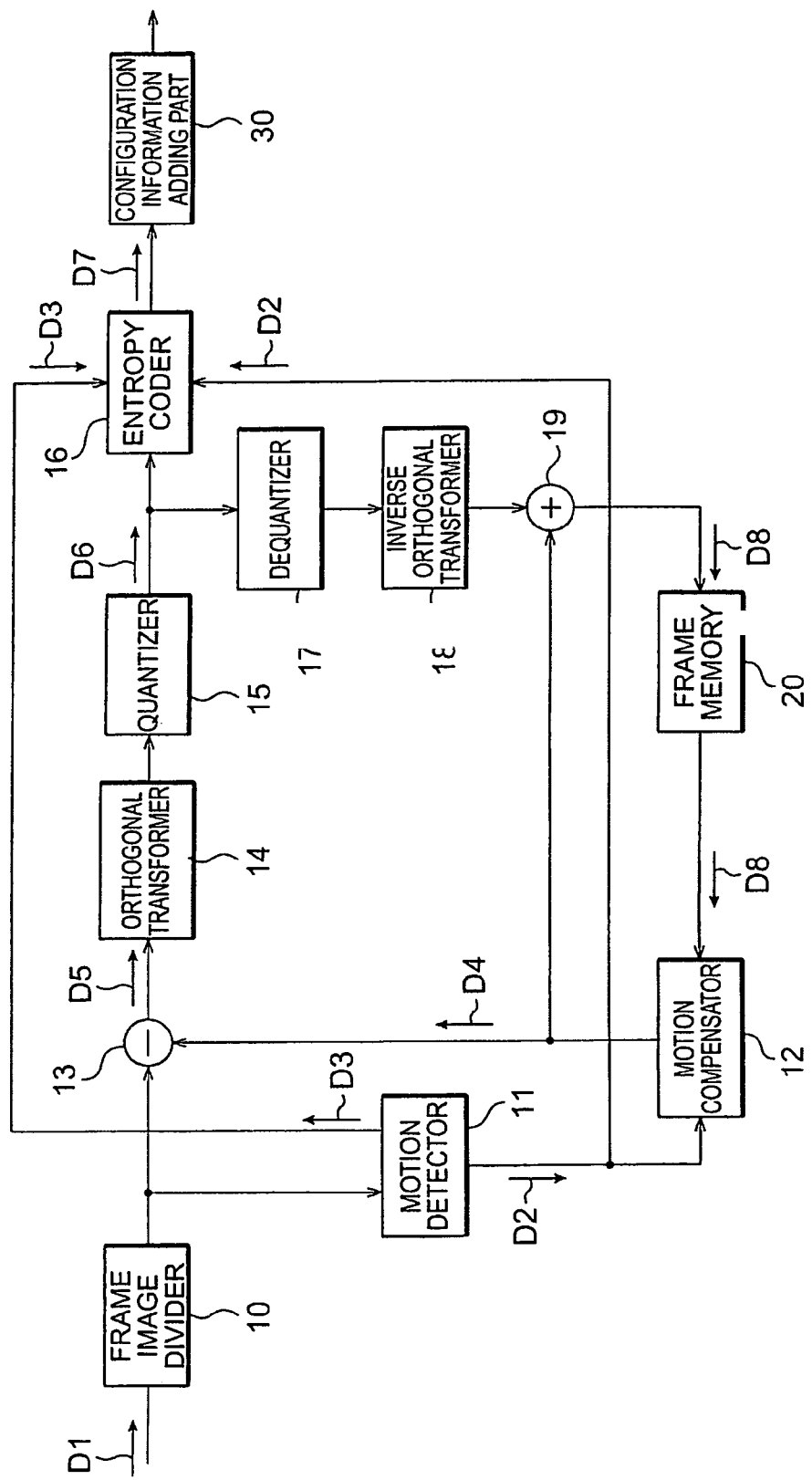
FIG. 2 is a block diagram showing a configuration of an embodiment of the image encoding apparatus.
Figure 3A:
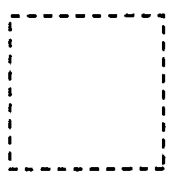
FIGS. 3A to 3J are schematic illustrations showing an example of coding modes used in motion compensation.
Figure 3B:
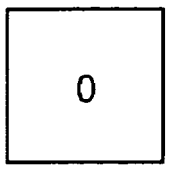
Figure 3C:
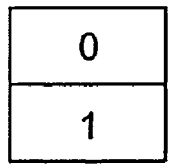
Figure 3D:
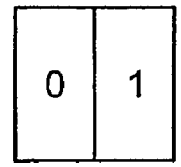
Figure 3E:
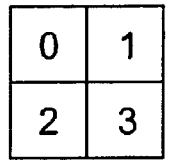
Figure 3F:
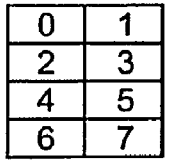
Figure 3G:
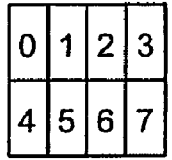
Figure 3H:
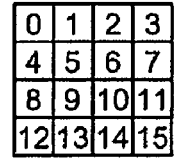
Figure 3I:
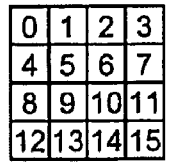
Figure 3J:
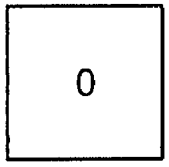

FIG. 2 is a block diagram showing the configuration of an embodiment of the video encoding apparatus according to the present invention. The video encoding method shown in FIG. 1 will be further described below with reference to the video encoding apparatus shown in FIG. 2. In the description below, the input frame image D1 fed as an object of coding into the video encoding apparatus is assumed to be a moving picture mainly consisting of time-series frame images. It is, however, noted that the video encoding method and video encoding apparatus according to the present invention are also similarly applicable to still images each consisting of one frame, by omitting the blocks associated with the motion compensation from the illustration in FIG. 2.

The input frame image D1 fed as an object of coding is first divided into macroblocks of the size of 16 pixels×16 lines by frame image dividing part 10. In the DCT (orthogonal transform) described later, for example, the H.26L coding method uses DCT blocks of the size of 4 pixels×4 lines. In this case, one macroblock has sixteen luminance (Luma) blocks and eight color-difference (Chroma) blocks in the DCT. The image coding is carried out for each of these blocks.

The frame image D1 is fed into motion detection part 11 to detect motion of an image in each macroblock. The motion detection part 11 compares the image data in a macroblock to be subjected to the detection of motion, with image data in a frame image as a reference frame, to detect a motion vector D2 indicating the motion of the image.

Specifically, the motion detection part 11 refers to a predetermined image region in local decoded image D8 stored as an already-encoded frame image in frame memory 20, to search for a pattern similar to the macroblock of input frame image D1 as a current object of coding. Then the motion vector D2 is determined based on a spatial movement amount between the similar pattern and the macroblock. At this time, a coding mode used for the motion compensation in the macroblock is selected out of a plurality of coding modes prepared for the motion compensation.

FIGS. 3A to 3J are schematic diagrams showing an example of the coding modes prepared for the motion compensation. In the example exemplified in FIGS. 3A to 3J, the coding modes prepared are ten coding modes including a skip (Skip) mode 0 in which no motion compensation is made, inter-modes 1–7 in which the interframe coding is carried out using one of block segmentation ways into motion compensation blocks different among the modes, and intra-modes 8, 9 in which the intraframe coding is carried out using one of block segmentation ways different between the modes. The aforementioned motion vector D2 is assigned to each of segmented motion compensation blocks shown in FIGS. 3B–3H, for each macroblock in the inter-modes 1–7 to effect the interframe coding.

After the motion vector D2 is obtained, the motion compensation part 12 generates a motion predictive image, using the motion vector D2 from the motion detector 11 and the local decoded image D8 from frame memory 20. A predictive frame image D4 against the input frame image D1 is obtained by determining motion vectors D2 of all the macroblocks in the frame image D1 and generating motion predictive images using them. Subsequently, subtracter 13 generates a difference (prediction residual) frame image D5 between the input frame image D1 and the predictive frame image D4. In the case where the frame image is coded by intraframe coding, the predictive frame image D4 is not created, but the input frame image D1 is used as frame image D5 as it is. This frame image D5 is image data expressed by space coordinates as the input frame image D1 was, and this space image data D5 is an object of the subsequent orthogonal transform and arithmetic coding.

The image data of frame image D5 is fed into the orthogonal transform part (orthogonal transform means) 14. The orthogonal transform part 14 performs the orthogonal transform of each of orthogonal transform blocks (e.g., sixteen luminance blocks and eight color-difference blocks) in each macroblock, for the frame image D5 by space coordinates. Then it generates a plurality of orthogonal transform coefficients as image data by spatial frequencies. The orthogonal transform coefficients are quantized using predetermined quantization parameters by quantizer 15 to obtain final quantized orthogonal transform coefficients D6 as an object of the arithmetic coding.

FIGS. 4A and 4B are illustrations showing the orthogonal transform of image data. Image data of each block resulting from the division for the orthogonal transform in the frame image D5 is spatial image data and is expressed by 4×4 spatial image components a11-a44 defined by horizontal and vertical coordinates, as exemplified by 4×4 image components in FIG. 4A. The orthogonal transform part 14 performs the orthogonal transform of the spatial image data by a predetermined transformation method to transform it into image data shown in FIG. 4B. The resultant image data is frequency image data and is expressed by orthogonal transform coefficients f11–f44 which are 4×4 frequency image components defined by horizontal and vertical frequencies.

A specific orthogonal transform applicable is, for example, the Discrete Cosine Transform (DCT). The DCT is the orthogonal transform using the cosine terms of the Fourier transformation and is often used in the video coding. The DCT of spatial image data results in generating DCT coefficients f11–f44 as frequency image data. The DCT, for example, in the H.26L coding method, uses 4×4 DCT blocks as shown in FIGS. 4A–4B, as orthogonal transform blocks.

The quantized orthogonal transform coefficients D6 generated by the orthogonal transform part 14 and quantizer 15 are entropy coded by the arithmetic coding using the predetermined probability table, at the entropy coding part (corresponding to the coding means and configuration information deriving means) 16. This generates coded data D7 as compressed data of the input frame image D1.

The arithmetic coding of the motion vector D2 and coding mode information D3 is normally carried out using the probability table different from that in the arithmetic coding of the quantized orthogonal transform coefficients D6. In the arithmetic coding of the quantized orthogonal transform coefficients D6, it is also possible to employ different probability tables between the arithmetic coding of the luminance blocks and the arithmetic coding of the color-difference blocks. Although not shown, a condition for coding of the entire image or the entire slice, e.g., the information for indicating either the intraframe coding or the interframe coding, is also added together to the header.

In the present video coding apparatus, the quantized orthogonal transform coefficients D6 generated by the orthogonal transform part 14 and quantizer 15 are subjected to decoding by dequantizer 17 and inverse orthogonal transform part 18. The decoded image data and predictive frame image D4 are added at adder 19 to generate local decoded image D8. This local decoded image D8 is stored into frame memory 20 to be utilized in the motion compensation for other frame images.

Figure 5:
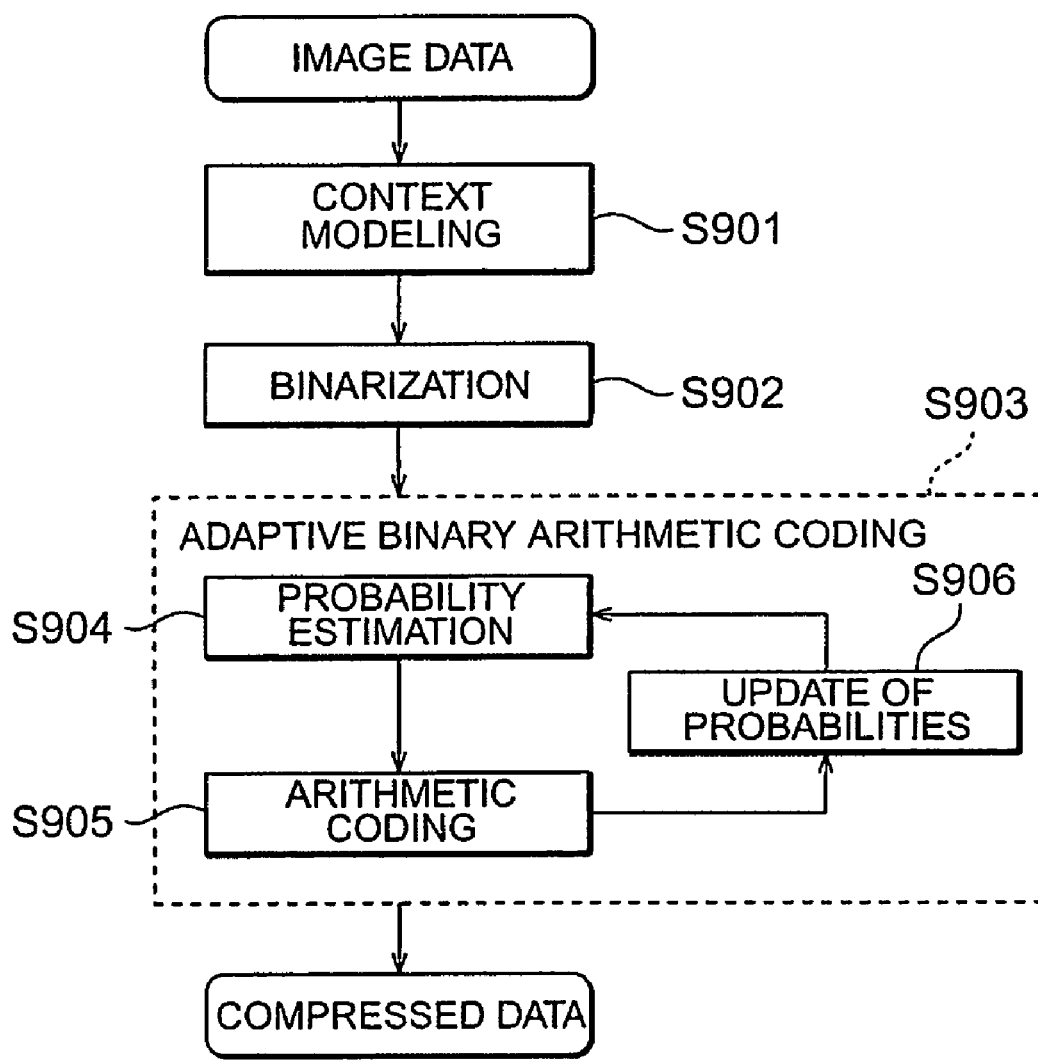
FIG. 5 is a flowchart showing an example of the image encoding method using the arithmetic coding.

The arithmetic coding step (S106, cf. FIG. 1) will be described below in more detail. Here an example of the arithmetic coding will be described with reference to FIG. 5. First, probability tables used in the arithmetic coding are prepared by the number of changeovers by the context modeling. In the present embodiment a plurality of probability tables are prepared according to the result of the image coding process (either interframe or intraframe, etc.) in an adjacent macroblock as the context modeling. Each probability table is provided with a counter a for storing the frequency of occurrence of signal [1] and a counter b for storing the frequency of occurrence of all signals (the number of signal [0]+signal [1]). Before starting the coding in a slice, initial values are first put into all the counters of this probability table. Then the entropy encoder 16 performs the context modeling based on the input coded data (S901 in FIG. 5) and the binarization of the coding table (S902 in FIG. 5) to determine the probability table used for each of bits thus binarized. Thereafter, the adaptive binary arithmetic encoder first calculates a probability a/b of occurrence of signal [1] from the counters in the probability table used, and performs the arithmetic coding using this probability. After completion of this arithmetic coding, in order to effect learning of the probability table, the counter or counters in the probability table used are given an increment: where coded data was signal [0], the counter b is given an increment of 1; where coded data was signal [1], the counters a and b are given an increment of 1. If the probability is set finer, depending upon the capacity of a buffer retaining the upper limit of the interval as an intermediate result of the arithmetic coding, it can cause some inadequacy in the result of computation. Therefore, where the value of counter b reaches a certain fixed value, the counters a, b both are divided by two, so as to decrease the values of the counters. This sequential processing is carried out for the entire coded data in a slice, thereby implementing the entropy coding by CABAC.

Next, a method of setting the initial values in the entropy coding, which is one of the features of the present embodiment, will be specifically described.

In order to set the initial values of the probability table so as to fit the characteristics of a moving picture as an object of coding, it is desirable to analyze the entire moving picture as an object of coding and determine the initial values based thereon. A method of implementing it will be described. First, an original video signal as an object of coding is processed by the coding operation described in FIG. 1, including the motion compensation, the orthogonal transform, etc. to create data of the quantized orthogonal transform coefficients, motion vectors, etc. as target data to be subjected to the arithmetic coding. Then the data thus created is subjected to the context modeling in CABAC and the binarization operation, and symbol occurrence counts of [0] and [1] are compiled in each probability table allocated by the context modeling. At this time there is no need for actually carrying out the arithmetic coding process, and it is sufficient to know frequencies of occurrence of [0] and [1] in each probability table. Then the initial values suitable for coding are calculated from the frequencies of occurrence of symbols in each probability table obtained herein. A desirable method of this calculation is a method of obtaining such initial values as to provide a ratio of integers approximately equivalent to the ratio of frequencies of [0] and [1]. It is also necessary not to exceed a maximum value allowed in expression of each probability table in CABAC. For example, supposing that the result of the compiling operation was [0]:4000 and [1]:1000 and that the maximum available for the probability tables was 50 as a total of [0] and [1], the initial values to be set should desirably be either of ([0]:[1])=(4:1), (8:2), (12:3), . . . , (36:9). In this respect, where tendencies of occurrence of 0 and 1 are approximately constant throughout each slice, instead of such small values as (4:1), the initial values should better be set greater so as to make variation of probabilities gentler. Conversely, if the change in tendencies of occurrence of [0] and [1] is great among slices, the initial values should better be set small so as to make the learning speed faster.

From the viewpoint of achieving improvement in coding efficiency immediately after the initialization, it is also possible to analyze only each slice instead of the entire image, perform the aforementioned coding process and compiling operation, and then obtain the initial values. This can reduce the load of the coding operation for checking the characteristics of the entire picture as in the above technique and also increase the coding efficiency immediately after the initialization. In the above embodiment the initial values were set by analyzing the image/slice as an object of coding, but it is also possible to set the initial values on the basis of statistics of images/slices coded before the image/slice in question as an object of coding.

Figure 6:
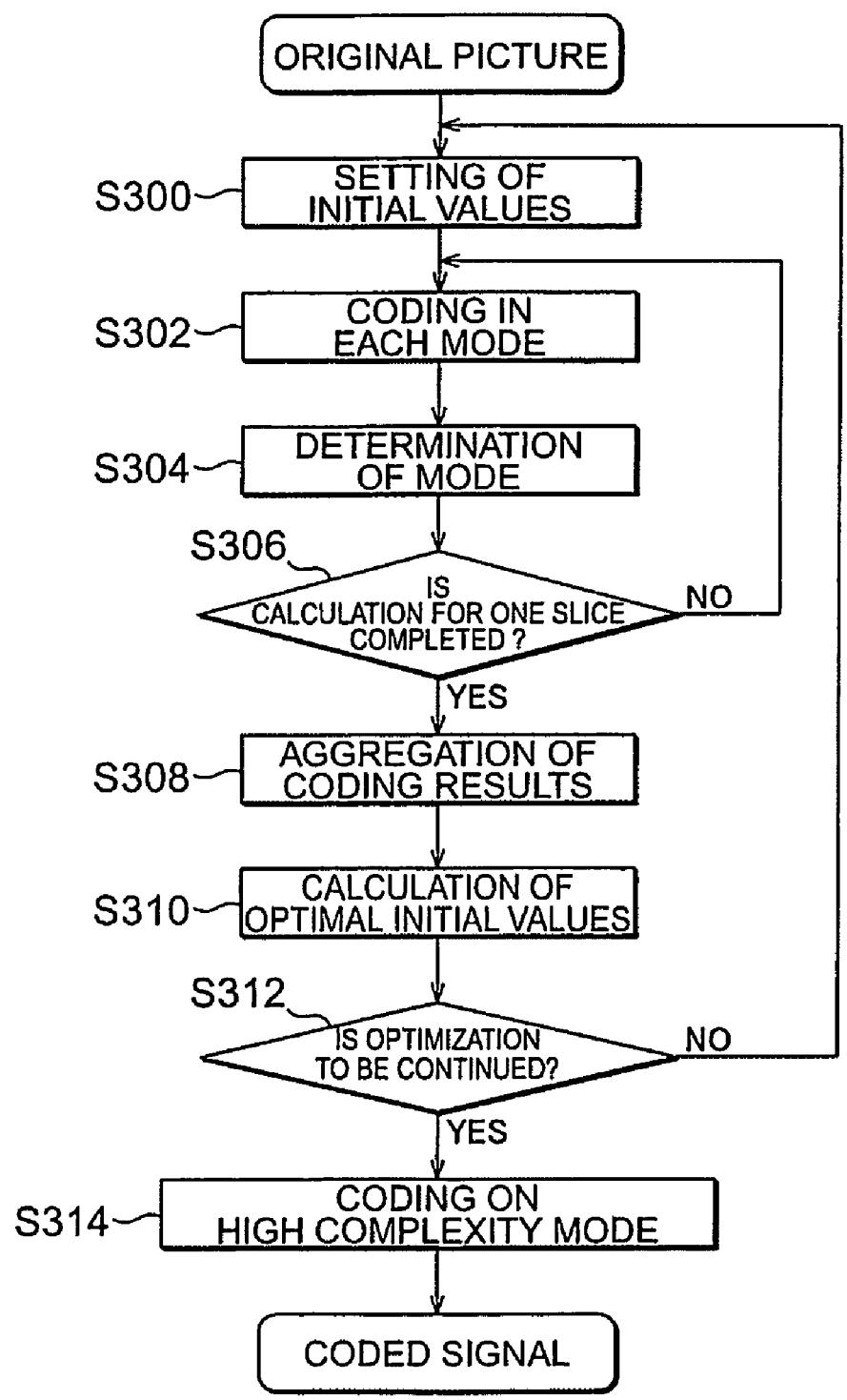
FIG. 6 is a diagram showing the flow of initialization on High Complexity Mode.

The H.26L method permits the use of the optimization technique called High Complexity Mode, and the above initial value setting on this mode can be implemented by the method described below. FIG. 6 shows the flow of processing on the High Complexity Mode.

In the High Complexity Mode, the initial values are first set (S300); coding is actually carried out in each of the coding modes as shown in FIGS. 3A–3J, based on the initial values (S302); qualities of decoded images and bit counts necessary for coding are determined from the results of the coding and the best coding mode is selected as to the two results in terms of coding efficiency (S304). This permits us to seek for a coding mode capable of achieving the highest coding efficiency without change in the initial values. This flow is repeated for all macroblocks constituting one slice being a partition unit of coding (S306) to seek for the optimal coding mode. Subsequently, where the setting of initial values in the present embodiment is carried out in that mode, counts recorded in the counters in each probability table are compiled from the result of the selected mode (S308), and after completion of calculation for all the macroblocks in one slice, the initial values of each probability table are calculated based on the values of the counters finally obtained (S310). Whether the optimization of initial values should be carried on is then determined based on differences between the calculated initial values and the initial values preliminarily set at step S300 (S312). Where the optimization is determined to be discontinued, coding of the slice in question on the High Complexity Mode is again carried out using the calculated initial values (S314). The above permits the coding by High Complexity Mode to be carried out at the same time as the optimal initial value search. If this work is carried on until the initial values of the probability table set and the values of the probability table finally obtained after the above calculation converge within a fixed range, it will become feasible to search for the optimal initial values and for the coding mode capable of achieving the result of coding with maximum efficiency by the initial values.

The initial value calculating method described herein is just an example of the present embodiment, and the initial values may be calculated by any other method. For example, a potential method is such that a relation is preliminarily investigated between some candidate values to become initial values, and properties of variation of signal values of moving pictures to that those candidate values are suitably applicable, only analysis on variation of signal values of a moving picture to be coded is carried out without pre-coding in the coding operation, and then the initial values to be used are determined.

The present embodiment described the configurations pursuant to the ITU-T H.26L video coding method, but the present invention does not have to be limited to the H.26L method or the video coding methods. The present invention can also be applied to various signal coding methods in which the arithmetic coding is carried out in partition units of a coding target signal and in which the probability-related information in the arithmetic coding is initialized in each of the partitions.

Described below is a method in which configuration information adding part (corresponding to the configuration information adding means) 30 adds the configuration information about the initial values of the probability table to the header.

A technique of putting the configuration information into the header may be a method of binarizing the initial values and putting them as fixed-length codes as they are, or a method of transmission using the entropy coding such as the Huffman coding or the like. When the Huffman coding is utilized, it is also possible to apply UVLC (Universal VLC), which is adopted, for example, in H.26L. An example of the coding by UVLC is presented in FIG. 7. By the definition as shown in FIG. 7, any initial value can be coded. The timing of notification of the configuration information needs to be prior to arithmetic coding data in a layer as an object. An example of data transmission where the configuration information is added to the header of the sequence layer will be described with reference to FIG. 8.

Figure 8:
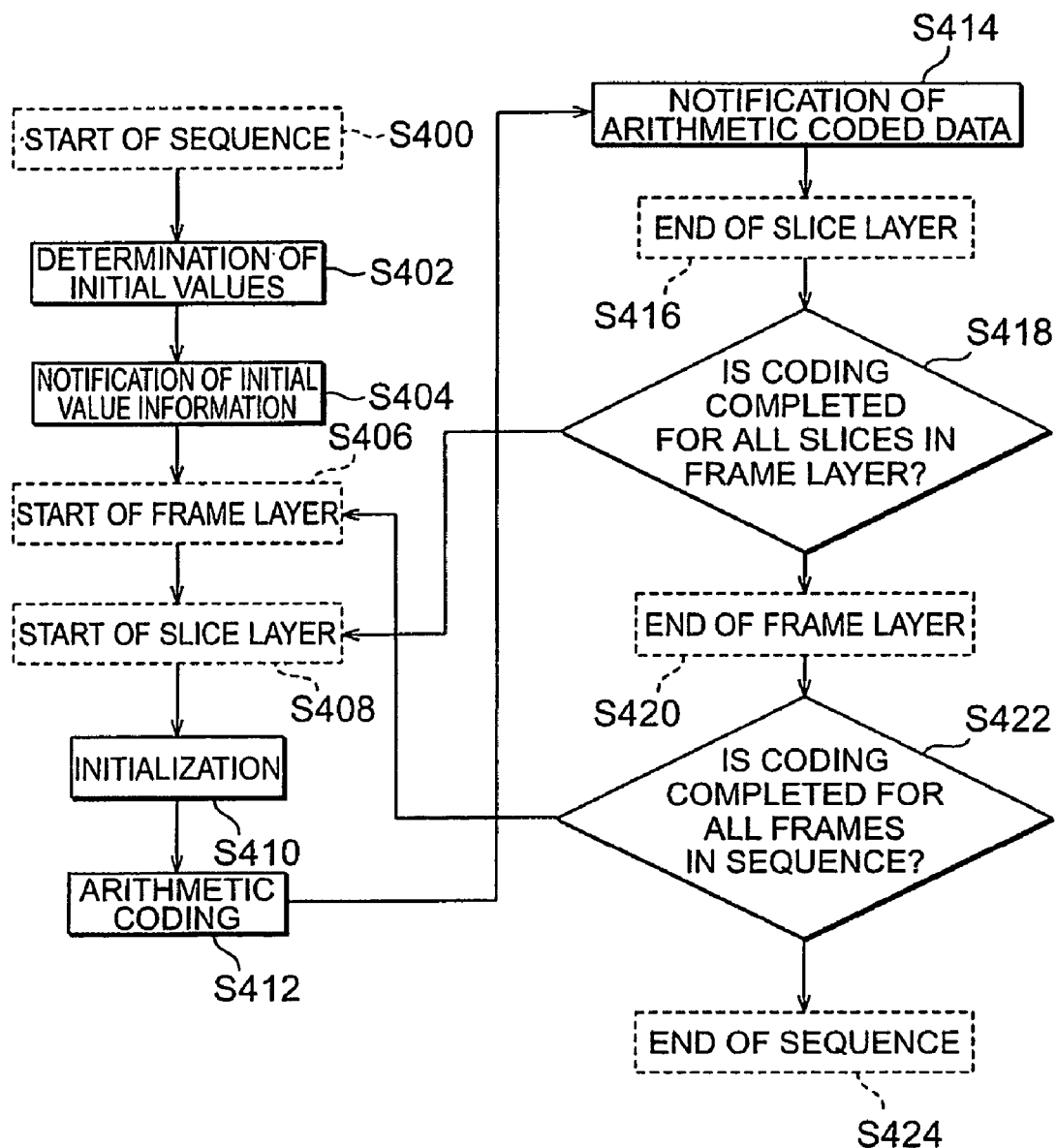
FIG. 8 is a diagram to illustrate an example of data transmission where the configuration information is added to the header of the sequence layer.

Referring to FIG. 8, the coding of a sequence is initiated (S400), the aforementioned initial value determination is carried out (S402), and thereafter the determined initial values are outputted (S404). Thereafter, the coding of the frame layer is started (S406), and subsequently, the coding of the slice layer is started (S408). In the coding of the slice layer, the probability table is initialized by the determined initial values (S410), and the arithmetic coding in the slice layer is carried out using the probability table (S412). After completion of the arithmetic coding, the arithmetic coded data is notified of (S414), and the coding of the slice layer ends (S416). Thereafter, the coding is repeatedly carried out similarly before all the slice layers in the frame are encoded (S418). After completion of the coding of the frame layer (S420), the coding is repeatedly carried out similarly before all the frame layers in the sequence are encoded (S422). After completion of the coding of all the frames, the coding of the sequence layer ends (S424).

Figure 23:
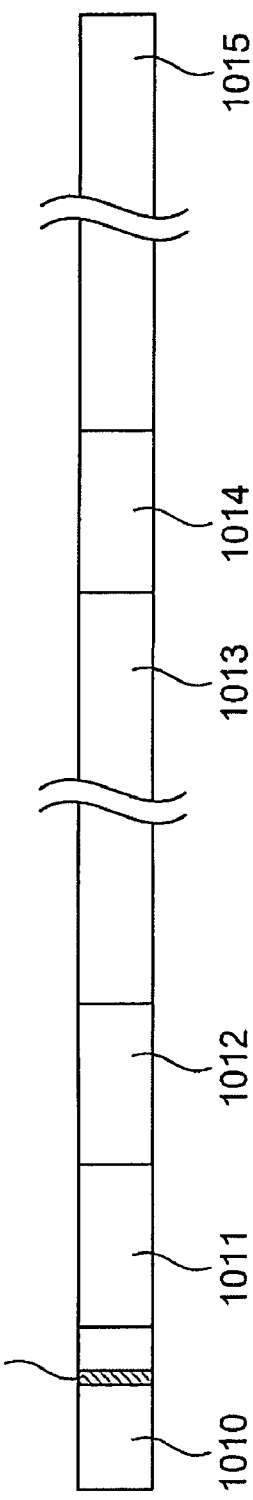
FIG. 23 is an illustration schematically showing a data format where the configuration information is added to the header of the sequence layer.

FIG. 23 shows the data format generated by the processing shown in FIG. 8. The data format shown in FIG. 23 contains a sequence header 1010, a frame header 1011, slice headers 1012 and 1014, image data 1013 and 1015 of respective slices, and coded data 1016 of the configuration information. The sequence header 1010 indicates a start of a sequence. The sequence header 1010 contains common information about the entire sequence, e.g., the image size, either progressive scanning or interlace scanning, and so on. A frame header contains common information about a frame image like information indicating the type of coding, e.g., either intraframe coding or interframe coding. FIG. 23 shows the frame header 1011 of the first frame in the sequence. A slice header contains common information about a slice like the initial value of quantization step for quantization of data in the slice. FIG. 23 shows the slice header 1012 of the first slice and the slice header 1014 of the second slice in the first frame. In the processing shown in FIG. 8, the coded data 1016 of the configuration information about the initial values used in the arithmetic coding is stored into the sequence header 1010.

In the present embodiment the sequence header contains the information about the initial values of the probability table to be notified of, but it is also possible to put the configuration information into the headers of the frame layer or the slice layer which is a lower layer than the sequence layer. In this case, the configuration information can be varied more frequently than where it is put into the sequence header. Therefore, it is effectively applied to cases where the configuration information to be used in the initialization of the probability table should better be varied in various ways in the same sequence, e.g., cases of moving pictures wherein characteristics of images frequently largely vary midway because of scene changes, cases of moving pictures wherein characteristics of moving images largely vary within the same frame because of quick motion, and so on. In such cases, it is desirable to determine the initial values for each frame or for each slice on the basis of the result of coding in the frame or slice in question.

On the other hand, putting the configuration information into each frame layer or slice layer can result in increasing the information volume of the added configuration information more than the effect by the change of the initial values and failing to contribute to increase of coding efficiency as a whole. A potential method for overcoming it is such that a flag indicating whether or not there is a change in the configuration information is put into the header of each frame layer or into the header of each slice layer, or into the both; where the change of initial values can achieve adequate effect, the flag is set ON and the configuration information is notified of; where the change is determined to yield little effect, the flag is set OFF and the configuration information is not notified of. On this occasion, the configuration information to be used for the initialization without notification of initial values can be the configuration information used in the right preceding slice or frame, or can be the configuration information determined in an upper layer such as the sequence layer or the frame layer. The former is effective to cases where the initial values changed are used long because of variation in properties with a scene change in a moving picture, and the latter is effective to cases where a property change of a moving picture is local and more efficient coding by the changed initial values can be achieved in only the slice or frame in question. When the following method is used as a method of determining the configuration information used in the case of the initial values being not changed as described, it is feasible to achieve agreement of determination on the configuration information between on the encoder side and on the decoder side without explicit notification. Namely, it is possible to employ such a configuration that the change of the configuration information is normally used in only the pertinent slice and thereafter the configuration information is returned to the one determined in the upper layer as in the latter, and that where the change of the configuration information continuously occurs in a plurality of slices or frames and the number of continuous changes exceeds a predetermined threshold, the configuration information is assumed to continuously have changed and the configuration information to be used is set to the one in the right preceding slice or frame as in the former.

Figure 9:
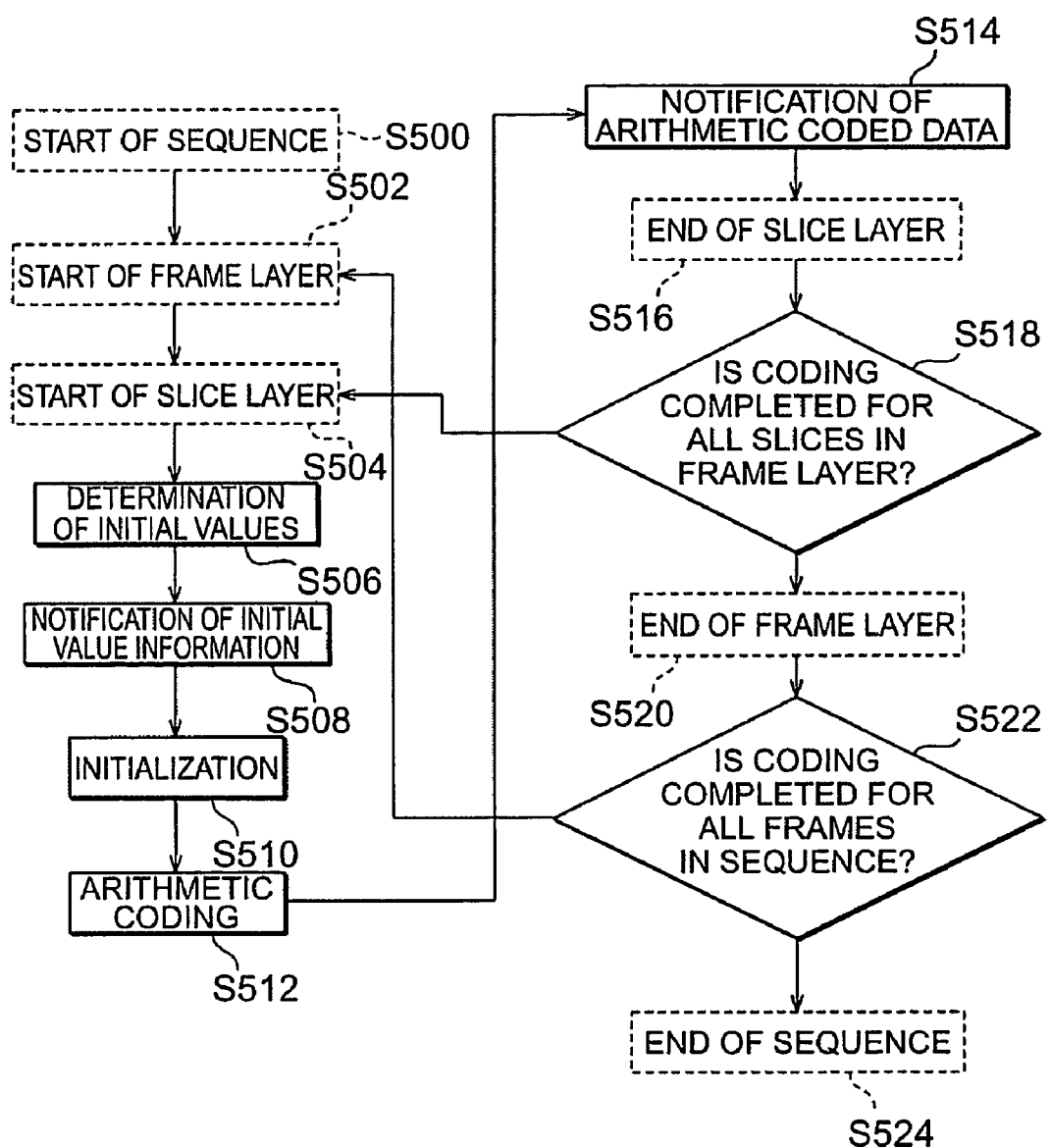
FIG. 9 is a diagram to illustrate an example of data transmission where the configuration information is added to the header of the slice layer.

Next, FIG. 9 shows a flow about an example of the coding and data output technique where the configuration information is notified of by the headers of slices. First, the coding of a sequence layer is started (S500); subsequently, the coding of a frame layer in the sequence layer is started (S502); furthermore, the coding of a slice layer in the frame layer is started (S504). First, the initial values for initialization of the slice layer are set (S506); the initial values thus set are notified of (S508); the probability table is initialized by the initial values (S510). The arithmetic coding of the slice layer is carried out using the probability table with the initial values set (S512); after completion of the arithmetic coding, arithmetic coded data is notified of (S514); the coding of the slice layer ends (S516). Thereafter, the coding is repeatedly carried out similarly before all the slice layers in the frame are coded (S518). After completion of the coding of the frame layer (S520), the coding is repeatedly carried out similarly before all the frame layers in the sequence are coded (S522). After completion of the coding of the all the frames, the coding of the sequence layer ends (S524).

Figure 24:
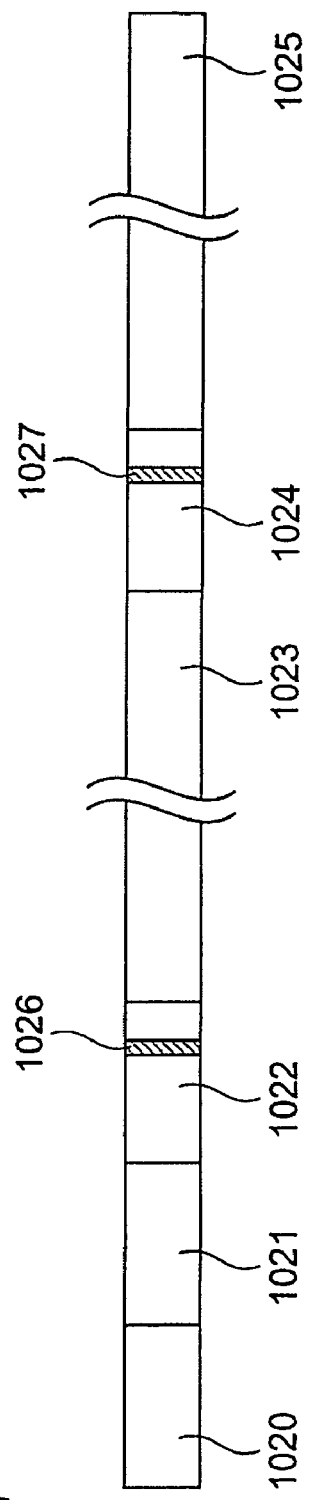
FIG. 24 is an illustration schematically showing a data format where the configuration information is added to the header of the slice layer.

FIG. 24 shows the data format generated by the processing shown in FIG. 9. The data format shown in FIG. 24 contains a sequence header 1020, a frame header 1021, slice headers 1022 and 1024, image data 1023 and 1025 of slices, and coded data 1026 and 1027 of configuration information. The sequence header 1020 is a header indicating a start of the sequence. The sequence header 1020 contains common information about the entire sequence, e.g., the image size, either progressive scanning or interlace scanning, and so on. Each frame header contains common information about a frame image like information indicating the type of coding, e.g., either intraframe coding or interframe coding. FIG. 24 shows the frame header 1021 of the first frame in the sequence. Each slice header contains common information about a slice such as the initial value of quantization step for quantization of data in the slice. FIG. 24 shows the slice header 1022 of the first slice and the slice header 1024 of the second slice in the first frame. In the processing shown in FIG. 9, the coded data 1026, 1027 of the configuration information about the initial values used in the arithmetic coding are stored in the corresponding slice headers 1022, 1024, respectively.

In the case where the configuration information is notified of by the header of the frame layer, the initial value determination and the initial value information notification can be performed between the start of the frame layer and the start of the slice layer.

As for the configuration information to be included in the header, instead of transmitting the initial values of the probability table as the configuration information as they are, it is also possible to send differences thereof from the initial values in the previous frame or slice as described previously, or to send differences thereof from the initial values set in an upper layer. By inserting the configuration information in such forms, where the configuration information is notified of by the entropy coding such as the Huffman coding or the like, probabilities of occurrence of the configuration information can deviate, which can reduce the overhead necessary for the configuration information by appropriate designing of variable-length codes.

Next, the video encoding program according to the first embodiment will be described. This video encoding program is a program for letting a computer execute the aforementioned video encoding method. Namely, this video encoding program is a program of letting the computer execute the step of dividing a coding target frame into macroblocks (S100); the transformation step (step S101) including the motion compensated interframe prediction (S102) and the orthogonal transform and quantization (S103); the coding step (S104) including the setting of initial values of the probability table and the derivation of the configuration information (S105, the configuration information deriving step), and the arithmetic coding (S106); and the step (S107, the configuration information adding step) of adding the header containing the configuration information to the coded signal. The video encoding program is provided, for example, in the form of computer data signals superimposed on a carrier wave.

The following will describe the effects of the video encoding method and video encoding apparatus according to the first embodiment.

In the video encoding method shown in FIG. 1, the frame image D1 is subjected to the data transformation operation such as the motion compensation and the orthogonal transform to obtain the quantized orthogonal transform coefficients D6 as an object of the entropy coding and thereafter the quantized orthogonal transform coefficients D6 are subjected to the arithmetic coding using the predetermined probability table, to generate the coded data D7 as compressed data. On the occasion of finally outputting the coded data D7, the initial values of the probability table are put into the header.

This permits the encoder side to freely configure the initial values of the probability table used in the arithmetic coding. Namely, when the initial values are set to such values as to fit the characteristics of a moving picture as an object of coding as described in the present embodiment, it is feasible to keep small the decrease of coding efficiency occurring during the period from immediately after the initialization of the probability table to the update and learning of the probability table.

Since the video encoding apparatus according to the present embodiment is also configured to insert the initial values of the probability table into the header as in the above video encoding method, it is feasible to set appropriate initial values in each partition unit. As described above in the present embodiment, where the initial values are set to such values as to fit the characteristics of a moving picture as an object of coding, it is feasible to keep small the decrease of coding efficiency occurring during the period from immediately after the initialization of the probability table to the update and learning of the probability table.

The video decoding method and video decoding apparatus making use of the present invention will be described below.

Figure 10:
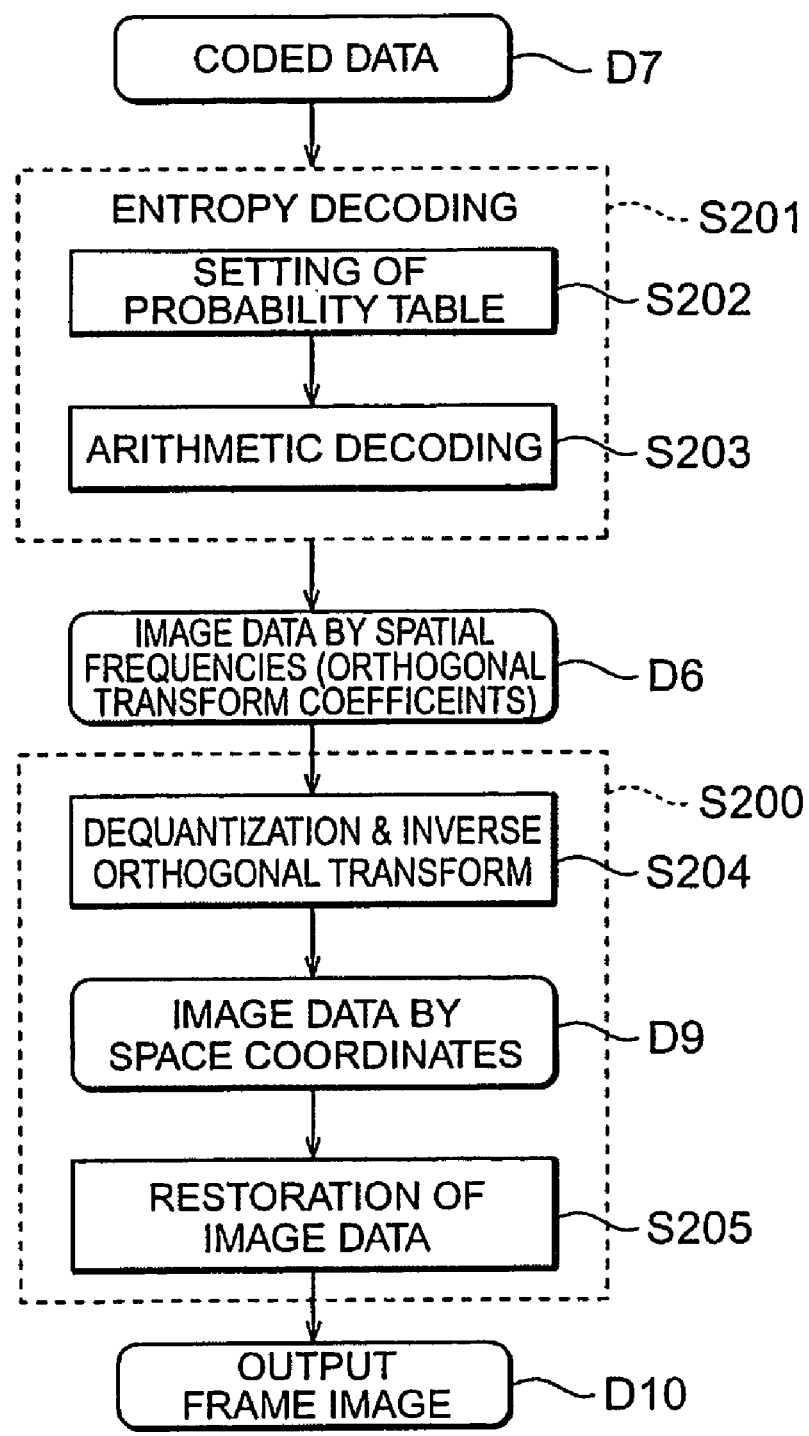
FIG. 10 is a flowchart schematically showing an embodiment of the image decoding method.

FIG. 10 is a flowchart schematically showing an embodiment of the video decoding method according to the present invention. The present decoding method is a video decoding method of performing predetermined decoding operation and data restoring operation for the coded data D7 generated by the video encoding method shown in FIG. 1, thereby restoring an output frame image D10 as an image corresponding to the input frame image D1.

In the image decoding method shown in FIG. 10, first, the entropy decoding is carried out using the arithmetic decoding for the coded data D7 to generate a plurality of quantized orthogonal transform coefficients D6 as image data expressed by spatial frequencies (S201, decoding step).

The coded data D7 has the layered structure consisting of the slice layer, the frame layer, and the sequence layer. The initialization of the probability table is carried out in each slice layer. In the present embodiment herein, the initial values of the probability table are set based on the configuration information of the initial values of the probability table added to the header. Namely, the initial values of the probability table applied to the coded data D7 are notified of by the header of the coded data D7, and they are set as initial values of the probability table (S202). Then the arithmetic decoding of the coded data D7 is carried out using the probability table initialized by the initial values (S203) to obtain the quantized orthogonal transform coefficients D6 as frequency image data.

Next, the predetermined data restoring operation is carried out for the quantized orthogonal transform coefficients D6 as image data for each of macroblocks in a frame image, thereby restoring the frame image (S200, restoring step). In the present embodiment, this restoring step consists of two steps S204, S205.

Specifically, dequantization operation and inverse orthogonal transform operation are successively carried out for the quantized orthogonal transform coefficients D6 to generate image data (spatial image data) D9 expressed by space coordinates (S204, inverse orthogonal transform step). Then predetermined data processing operation is carried out for the spatial image data D9 to effect transformation of the image data, thereby restoring the output frame image D10 (S205).

Figure 11:
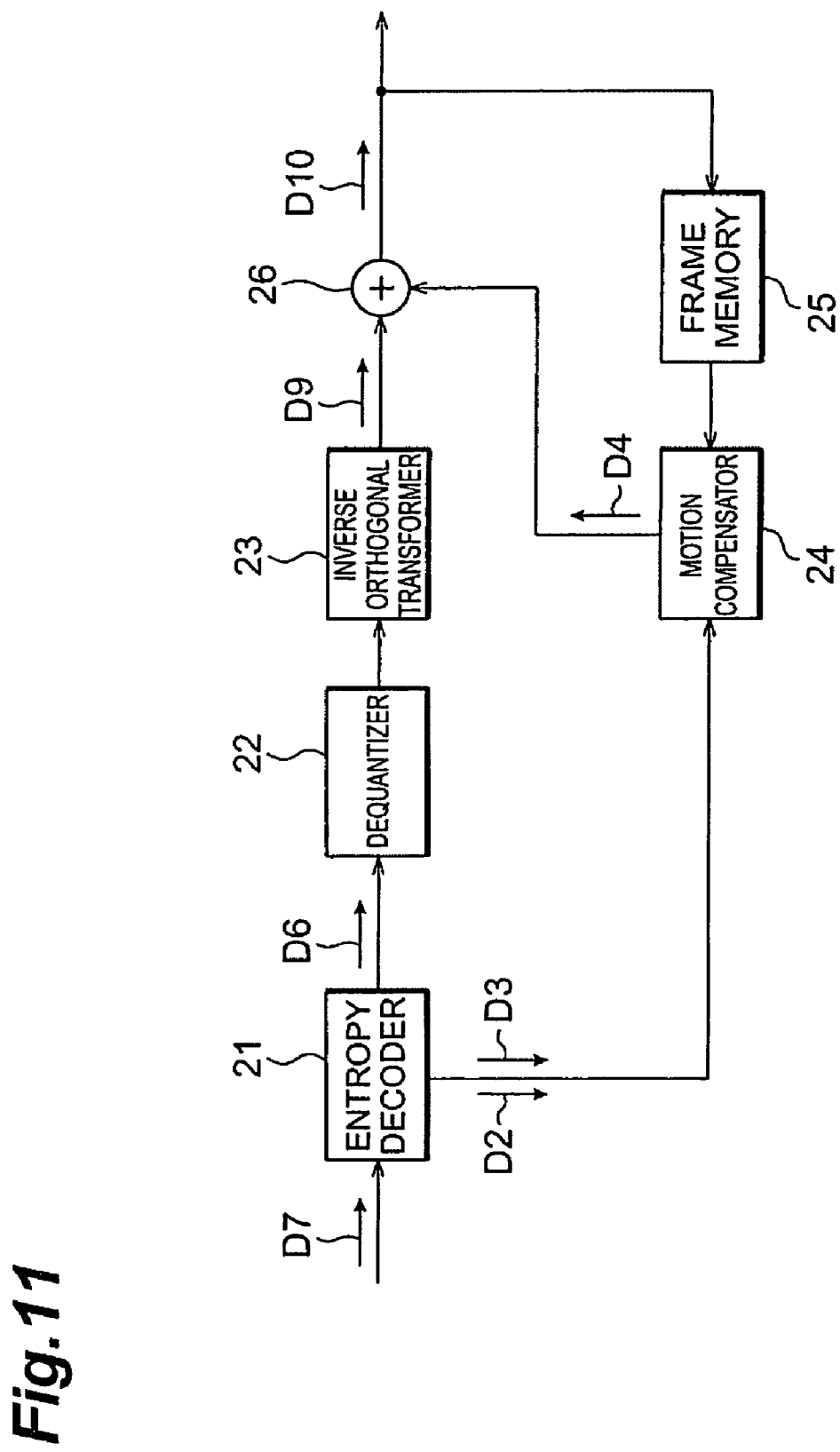
FIG. 11 is a block diagram showing a configuration of an embodiment of the image decoding apparatus.

FIG. 11 is a block diagram showing a configuration of an embodiment of the video decoding apparatus according to the present invention.

Coded data D7 fed as an object of decoding is supplied into entropy decoder (corresponding to the initial value setting means and the arithmetic decoding means) 21 to be entropy decoded by the arithmetic decoding using the predetermined probability table, to generate coding mode information D3, motion vectors D2, quantized orthogonal transform coefficients D6 as frequency image data, and others. The setting and initialization of the probability table used in the arithmetic decoding at entropy decoder 21, and the reception of initial values of the probability table are the same as those described above in the description of the flowchart shown in FIG. 10.

The quantized orthogonal transform coefficients D6 decoded at entropy decoder 21 are supplied into the restoring means comprised of dequantizer 21, inverse orthogonal transform part 23, motion compensator 24, and adder 26. The restoring means performs the predetermined data restoring operation for the quantized orthogonal transform coefficients D6 as image data for each of blocks in a frame image, thereby restoring the frame image D10.

First, the quantized orthogonal transform coefficients D6 are subjected to the dequantization and inverse orthogonal transform by dequantizer 22 and inverse orthogonal transform part (inverse orthogonal transform means) 23. This results in generating a restored frame image D9 as spatial image data. The restored frame image D9 is a frame image corresponding to the frame image D5 before the coding.

On the other hand, the motion vectors D2 are fed into motion compensator 24. The motion compensator 24 generates a predictive frame image D4, using the motion vectors D2 from entropy decoder 21 and an already-decoded frame image stored in frame memory 25. Then adder 26 adds the restored frame image D9 to the predictive frame image D4, and the frame image thus restored is outputted as an output frame image D10. When the coded data is one encoded by intraframe coding, the restored frame image D9 is outputted as an output frame image D10 as it is.

The video decoding program according to the first embodiment will be described below. This video decoding program is a program for letting a computer execute the aforementioned video decoding method. Namely, the video decoding program is a program for letting the computer execute the decoding step (S201) including the step of setting the initial values of the probability table on the basis of the configuration information in the header of the coded signal (S202, the initial value setting step), and the step of performing the arithmetic decoding based on the probability table with the initial values thus set (S203, the arithmetic decoding step); and the restoring step (S200) including the step of performing the dequantization and inverse orthogonal transform of the data thus decoded (S204), and the step of restoring the image data by the predetermined data processing operation (S205). The video decoding program is provided, for example, in the form of computer data signals superimposed on a carrier wave.

The effects of the video decoding method according to the present embodiment will be described.

In the video decoding method shown in FIG. 10, the coded data D7 is subjected to the arithmetic decoding using the predetermined probability table to obtain the image data D6, and thereafter the image data D6 is subjected to the data restoring operation to restore the frame image D10. The initial values of the probability table used in the arithmetic decoding are set to the values read out of the header.

This permits the decoder side to also use the probability table suitably set so as to fit the properties of each moving picture on the encoder side. Accordingly, the probability table is suitably set for the coded data D7 of the layered structure consisting of the slice layer, the frame layer, and the sequence layer, and the frame image can be suitably restored from the coded data D7 improved in the efficiency of data compression.

The video encoding method (apparatus) and video decoding method (apparatus) according to the second embodiment of the present invention will be described below. The video encoding method (apparatus) and video decoding method (apparatus) according to the second embodiment are identical in the fundamental flow to those according to the first embodiment and thus will be described with reference to the same drawings (FIGS. 1, 2, 10, and 11). The video encoding method (apparatus) and video decoding method (apparatus) of the second embodiment will be described below as to only different portions from the first embodiment.

The video encoding method (apparatus) in the second embodiment is different from the video encoding method of the first embodiment in that the configuration information adding step (configuration information adding means) is configured to select the initial values of the probability table used in coding, from in an initial value list known, or notified of by the header, and put them as configuration information into the header. The video encoding program of the second embodiment for letting a computer substantialize the video encoding method according to the second embodiment is also different in the configuration information deriving step and the configuration information adding step executed by the computer, from the video encoding program of the first embodiment. Namely, in the configuration information deriving step, which the video encoding program of the second embodiment makes the computer execute, the initial values of the probability table used in coding are selected from in the initial value list known, or notified of by the header, and in the configuration information adding step the values selected from in the initial value list are inserted as configuration information into the header. This permits the video encoding method (apparatus) of the second embodiment to designate the initial values of the probability table utilized for the arithmetic coding, on the encoder side, just as in the case of the first embodiment. If the initial values designated at this time are set to such values as to fit the characteristics of a moving picture as an object of coding, it is feasible to make small the decrease of coding efficiency occurring during the period from immediately after the initialization of the probability table to the update and learning of the probability table. Furthermore, the data actually transmitted is not the initial values themselves, but a number in the initial value list, and this configuration presents the advantage that even if it is notified of in each slice header, the volume of codes necessary for the notification will not increase too much.

The video decoding method (apparatus) of the second embodiment is configured to receive a number indicating the initial values of the probability table in the header, collate the number with the initial value list to retrieve the initial values, and perform the initialization of a slice in question by the values. The video decoding program of the second embodiment for letting a computer execute the video decoding method of the second embodiment is also different in the initial value setting step executed by the computer, from the video decoding program of the first embodiment. Namely, in the initial value setting step, which the video decoding program of the second embodiment makes the computer execute, the number indicating the initial values of the probability table is received in the header, and the number is collated with the initial value list to set the initial values of the probability table. In the second embodiment, therefore, the probability tables suitably set so as to match the properties of respective moving pictures on the encoder side can also be used on the decoder side. Therefore, it becomes feasible to suitably set the probability table for the coded data D7 having the layered structure consisting of the slice layer, the frame layer, and the sequence layer and suitably restore the frame image from the coded data D7 improved in the efficiency of data compression.

The following will describe a technique of selecting the initial values from in the initial value list and making the selected initial values notified of.

Where frequencies of occurrence of symbols in each table are obtained as statistical information of a moving picture, a desirable method of selecting the optimal initial values from in the list is to determine a ratio of frequencies of occurrence of [0] and [1] and select initial values nearest to the ratio from in the list. FIGS. 12A–12C show examples of initial value lists and code tables thereof. For example, where the frequencies are [0]:2000 and [1]:3000, the initial values desirably selected from in the list of FIG. 12A are those of (2, 3).

The initial values selected from in the list can be notified of by notification of a number indicating the initial values. This number notification method can be implemented by using fixed-length codes or by using variable-length codes like Huffman codes, as described as the initial value notification methods in the first embodiment. Particularly, the latter method achieves efficient coding, because it can determine the code lengths according to probabilities of occurrence of initial values. An example of coding of numbers by Huffman codes is indicated by codes in FIG. 12A. In this example, as the number of the initial values decreases, the code length becomes shorter, so as to implement efficient coding. In order to adapt to the magnitude of change in characteristics of moving pictures, as described in the first embodiment, it is also possible to place a multiplier code indicating a multiplier to the initial values, subsequent to the initial value code, and thereby permit use of multiples of the default initial values. By using such large initial values, it becomes feasible to control the influence of update of the probability table based on learning after the initialization and prevent the update of the probability table in the middle of the learning from negatively affecting the efficiency of the arithmetic coding.

An example of the multiplier codes is presented in FIG. 12B. For example, in the case where (2, 3) are selected as initial values in FIG. 12A and where 2 is selected as a multiplier, the code "10" is added subsequent to "11100" indicating (2, 3). This makes it feasible to perform the encoding and decoding using the initial values of (4, 6).

It is noted that these initial value list and initial value code table are just an example, and it is also possible to use any other initial value list and initial value code table. For example, in the case where it is preliminarily known that the probability of occurrence of 0 is very high, we can use an initial value list and initial value code table to make short the code lengths of the initial values with high probabilities of 0 as shown in FIG. 12C. It is also possible to prepare a plurality of such initial value lists and initial value code tables and selectively use them according to types of probability tables. In this case, a pattern of the selective use can be shared by the encoder and decoder in advance, or may be designated by assigning numbers to the respective initial value lists and sending information indicating the initial value list used in each type of the probability table, by the sequence header.

If there are no initial values suitable for coding of a certain slice in the initial value list, the actual initial values can be notified of, instead of the number of initial values, for the slice in question. A desirable technique of this notification is a method of transmitting an escape code corresponding to neither of the initial values in the list and placing the values of the initial values subsequent thereto. This permits the transmission of appropriate initial values and increase in the efficiency of the arithmetic coding even in the case where there are no initial values in the probability table suitable for increase in the efficiency of the arithmetic coding in the initial value list.

The number of initial values that can be controlled by one initial value number can be one, or a plurality of probability tables may be grouped to be controlled together by one initial value number. The former enables fine initial value setting, whereas the latter enables decrease of information volume of initial value numbers needed to be transmitted. How to combine the probability tables at this time is desirably to group probability tables of coding elements with similar properties into one. For example, in the case of the coding in the macroblock modes shown in FIGS. 3A–3J, the arithmetic coding is carried out using a plurality of probability tables for binarized data of the mode information, instead of using one probability table. Since a probability table about one coding element is considered to have a correlation with other tables, it is desirable to control the initial values by one group including them all. In cases where the luminance varies throughout the entire slice, e.g., where the entire screen becomes dark, it is probable that the property about the DC coefficient out of the DCT coefficients, associated with the luminance, varies. The number of probability tables used is not one in the coding of the DC coefficient, but the arithmetic coding is carried out using a plurality of probability tables for binarized information of the DC coefficient; therefore, it is desirable to handle these probability tables together.

For controlling a plurality of probability tables together as grouped, it is possible to control the initial values of all the probability tables by one code. For example, a potential method is to define initial values for respective sorts of pictures. Since sports pictures tend to contain significant motion information, a set of initial values of respective probability tables can be prepared and set so as to achieve better efficiency with large motion. In contrast, landscape pictures contain only simple motion, and thus a set of initial values may be set so as to achieve better efficiency with small motion.

The above described the technique of transmitting the information by the slice headers, but the initial value number as described in the present embodiment can also be transmitted by the other sequence header or slice header, or can be transmitted simultaneously by plural types of layers including the slice headers.

The video encoding method (apparatus) and video decoding method (apparatus) according to the third embodiment of the present invention will be described below. The video encoding method (apparatus) and video decoding method (apparatus) according to the third embodiment are identical in the fundamental flow to those in the first embodiment and the second embodiment, and thus will be described with reference to the same drawings (FIGS. 1, 2, 10, and 11). The video encoding method (apparatus) and video decoding method (apparatus) according to the third embodiment will be described as to only differences from the first and second embodiments.

The video encoding method (apparatus) in the third embodiment is different from the video encoding methods of the first and second embodiments in that the initial values of the probability table used in coding are determined by combining the configuration information inserted in the header in the configuration information adding step, with previous information in the header. The video encoding program of the third embodiment for letting a computer substantialize the video encoding method of the third embodiment is also different in the configuration information deriving step and the configuration information adding step executed by the computer, from the video encoding programs of the first and second embodiments. Namely, in the configuration information adding step, which the video encoding program of the third embodiment makes the computer execute, the initial values of the probability table used in the coding are converted into a combination of the previous information in the header with the configuration information to be put into the header, by a predetermined method, and in the configuration information adding step the previous information and configuration information is put into the header of the coded signal. This permits the video encoding method (apparatus) of the third embodiment to designate the initial values of the probability table utilized in the arithmetic coding, on the encoder side, as in the case of the first and second embodiments. If the initial values designated at this time are set to such values as to fit the characteristics of a moving picture as an object of coding, it becomes feasible to keep small the decrease of coding efficiency occurring during the period from immediately after the initialization of the probability table to the update and learning of the probability table. Furthermore, because the previous information in the header is also used, the information volume necessary for the notification of initial values can be reduced by making use of the correlation of the initial values in the arithmetic coding with the image size, quantization step value, either intraframe coding or interframe coding, and so on.

The video decoding method (apparatus) of the third embodiment is configured to receive the configuration information indicating the initial values of the probability table in the header, calculate the initial values by combining the configuration information with the previous information in the header, and perform the initialization of the slice in question by the values. The video decoding program of the third embodiment for letting a computer execute the video decoding method of the third embodiment is also different in the initial value setting step executed by the computer, from the video decoding programs in the first and second embodiments. Namely, in the initial value setting step, which the video decoding program of the third embodiment makes the computer execute, the configuration information indicating the initial values of the probability table is received in the header, and the initial values of the probability table are calculated by combining the configuration information with the previous information in the header. In the third embodiment, therefore, the decoder side can also use the probability table suitably set so as to fit the property of each moving picture on the encoder side. Accordingly, it becomes feasible to suitably set the probability table for coded data D7 having the layered structure consisting of the slice layer, the frame layer, and the sequence layer, and suitably restore the frame image from the coded data D7 improved in the efficiency of data compression.

The following will describe a technique of notification of the initial values using the previous information in the header.

The information described in various headers of a moving picture includes the video size, quantization step value, time code, the type of frame coding (intraframe or interframe), and so on. These parameters are in close correlation with video parameters to be coded. For example, the video size has such a correlation with the motion vectors indicating the magnitude of motion in a picture that the motion vectors become larger with increase in the video size. As the quantization step value becomes larger, the orthogonal transform coefficients often become smaller or null. The time code indicates the number of frames per definite time and thus can be an index for the tendency of magnitude of motion vectors.

A method of combining the header information with the initial value information can be a method of determining rough values of the initial values by previous information in the header and performing fine adjustment by the initial value configuration information. An example of determining the initial values from the header information is presented in FIG. 17. FIG. 17 shows a probability table used in the coding of motion vector information. The bin number shown in FIG. 17 indicates each Bit of a binary signal indicating motion vector information, and the initial value of 0 and the initial value of 1 indicate the initial values of the probability table in the arithmetic coding in each bin. In this example, the initial values of the probability table are different between the image size of QCIF (176×144 pixels) and the image size of CIF (352×288 pixels). For example, the bin number 0 is the context indicating whether there exists a motion vector, i.e., presence or absence of motion; since it is often the case that motion hard to be discriminated as motion in the QCIF size becomes able to be discriminated as motion in the CIF size, it is expected that there is a difference between probabilities of occurrence of symbols in this bin. Therefore, by making the difference between the initial values as in FIG. 17, it becomes feasible to bring the setting closer to values to be employed as initial values. Then a value for addition to or subtraction from the rough initial values is added as configuration information to the header. This configuration information may be the value itself added by the technique as described in the first embodiment, or may be added by preparing a list as described in the second embodiment and attaching a value selected from therein in the form of a fixed-length code or a variable-length code. FIG. 18 shows an example of the initial value setting by the list described in the second embodiment. This example enables the coding in lower information volume than in the case of directly designating the initial values.

The method of combining the header information with the initial value information, described herein, is just an example, and it is also possible to use any other method. For example, the initial value configuration information can be the multiplier code as shown in FIG. 12B, instead of the value for addition or subtraction as shown in FIG. 18, or it may be the both while preparing the both codes. It is also possible to prepare a plurality of initial value lists using the previous information in the header and give notification of a code indicating a list used as the initial value configuration information. An example thereof is presented in FIG. 19. In FIG. 19, three types of initial value lists are prepared according to magnitudes of motion in each of the identical screen sizes, in addition to the changeover in bin0 depending upon the screen sizes, and information about the list used is provided as initial value configuration information. Species of the header previous information used may be one kind or two or more kinds.

The initial values may be calculated by a formula incorporating the header previous information. For example, the quantization step value can be set in steps of one from 0 to 31 in H.26L, and it is thus probable that the setting of the lists as in FIG. 17 or 19 for all the quantization steps will increase the information volume of the lists and oppress the memory. The memory consumption can be kept down by setting the initial values according to the function expression using the quantization step value. An example of the function expression described below is a case of initial values of the context for coding of the orthogonal transform coefficients. In the case of the orthogonal transform coefficients, the probabilities of the coefficients becoming 0 decrease with decrease in the quantization step value, whereas the probabilities of the coefficients becoming 0 increase with increase in the quantization step value. The following formulas are an example of the function expression.

$$Ini(0) = (\text{set value}) + QP/10$$

$$Ini(1) = (\text{set value}) - QP/10 \; (QP: \text{quantization step value})$$

The initial value of 0 obtained by the above function herein is defined as Ini(0), and the initial value of 1 as Ini(1). The set value is a value derived according to the above code table or the like from the initial value configuration information attached to the header. By determining the initial values as in the above example, the quantization step value can be effectively utilized in the initial value setting and the information volume necessary for the initial value configuration information can be reduced. The quantization step value was used herein as the previous header information, but the previous header information may be any other parameter. For example, the number of macroblocks in a slice, i.e., the size of the slice is described in the slice header. For this reason, a learning possible period can be estimated from the number of macroblocks in the slice, and thus the learning speed may be controlled by changing the multiplier to the initial value configuration information according to this value.

Next, the video encoding method (apparatus) and video decoding method (apparatus) according to the fourth embodiment of the present invention will be described. The present embodiment utilizes the probability state transition diagram as shown in FIG. 20, as an arithmetic coding method. Concerning the details of the state transition diagram, reference should be made to "Basic Technologies on International Image Coding Standards," coauthored by Fumitaka Ono and Hiroshi Watanabe and published by CORONA PUBLISHING CO., LTD. It will be briefly described herein. The video encoding method (apparatus) and video decoding method (apparatus) in the fourth embodiment are the same in the flow except for the arithmetic coding method as in the embodiments up to the third embodiment, and the description thereof is omitted herein.

In the arithmetic coding with the state transition diagram, variation and adaptation of probabilities is implemented on the basis of transition on a probability estimation table with a plurality of probability states. FIG. 20 shows an example of the state transition diagram of the probability estimation table. Here the dominant out of 0 and 1 in terms of the number of occurrence is treated as a more probable symbol, and the other as a less probable symbol. In FIG. 20, # represents address values indicating respective states, LSZ hexadecimal forms of probabilities of the less probable symbol, NM code values of states of the next transition upon selection of the more probable symbol, NL addresses of states of the next transition upon selection of the less probable symbol, and SW a switchover between the more probable symbol and the less probable symbol upon selection of the less probable symbol in the state in question. In the state of #0, the probabilities are set at approximately 50%.

The arithmetic coding using FIG. 20 is first started from the initial state of #0, i.e., a state in which the probabilities of the more probable symbol and the less probable symbol are approximately equal. Then LSZ at #0 is applied to the probability in the coding and thereafter a transition of probabilities into another state is made depending upon a symbol selected. For example, supposing at #0 the more probable symbol is selected, the transition is made to #1, and LSZ at #1 is applied to the calculation in the coding of the next symbol. Conversely, supposing the less probable symbol is selected at #0, the transition to #1 is made and a switchover is made between the more probable symbol and the less probable symbol. By making such progressive transitions in this way, it becomes feasible to make variation while applying the probabilities to the object of coding. In order to achieve quick learning of probabilities to stationary values, the transition diagram is configured so as to change the variation of probabilities by the state transition large during the initial stage of coding and set the change smaller with progress of the coding. In the transition diagram of FIG. 20 as an example, the states are separated into three stages of #0 to #5, #6 to #13, and #14 to #45.

In the video encoding method (apparatus) in the fourth embodiment, the initial state in the state transition diagram used in coding is attached in the configuration information adding step. This permits the video encoding method (apparatus) of the fourth embodiment to designate the initial values of probabilities utilized in the arithmetic coding, on the encoder side, just as in the case of the embodiments heretofore. If the initial values designated at this time are set to such values as to fit the characteristics of a moving picture as an object of coding, it becomes feasible to make smaller the decrease of coding efficiency occurring during the period from immediately after the initialization of probabilities to the time when the variation of probabilities by the state transition goes into the stationary state.

The video decoding method (apparatus) according to the fourth embodiment is configured to receive the configuration information indicating the initial state of the state transition diagram in the head and perform the initialization of the slice in question by the value of the configuration information. In the fourth embodiment, therefore, the decoder side is also able to use the probabilities suitably set so as to fit the properties of the respective moving pictures on the encoder side. Accordingly, it becomes feasible to suitably set the probabilities for the coded data D7 having the layered structure consisting of the slice layer, the frame layer, and the sequence layer and suitably restore the frame image from the coded data D7 improved in the efficiency of data compression.

A technique of notification of the initial state of the state transition diagram will be described below.

A conceivable technique of notification of the initial state is a method of converting a number indicating a state into a fixed-length code or a variable-length code and attaching it to the header. This method, however, has the problem that, because forty six states exist in the state transition diagram of FIG. 20, code lengths to be prepared become large and the average code length is also long. It is thus desirable to use the previous information in the header to curtail the volume of information attached, as described in the third embodiment. An example of this method is presented in FIGS. 21 and 22. In FIG. 21 the initial state of the state transition diagram about the arithmetic coding of motion vectors is determined by making use of the screen size which is a previously given parameter. Here the bin number represents a number of each bit of the motion vector information, as in the third embodiment, the initial start position an initial state number of the state transition diagram in the context of a bit in question, and the more probable symbol a symbol to be defined as a more probable symbol in the initial state out of "0" and "1." FIG. 22 defines the configuration information for conversion of the initial start position for each bit shown in FIG. 21. In FIG. 22, "number" represents serial numbers given to the respective configuration information entities, and the transition value the amount of transition from the initial state number in FIG. 21. "Direction" represents the direction of transition and a value for either positive or negative is assigned depending upon the direction of transition. "Code" represents variable-length codes assigned to the respective configuration information entities, and insertion of this code into various headers enables the addition of the configuration information.

Figure 25:
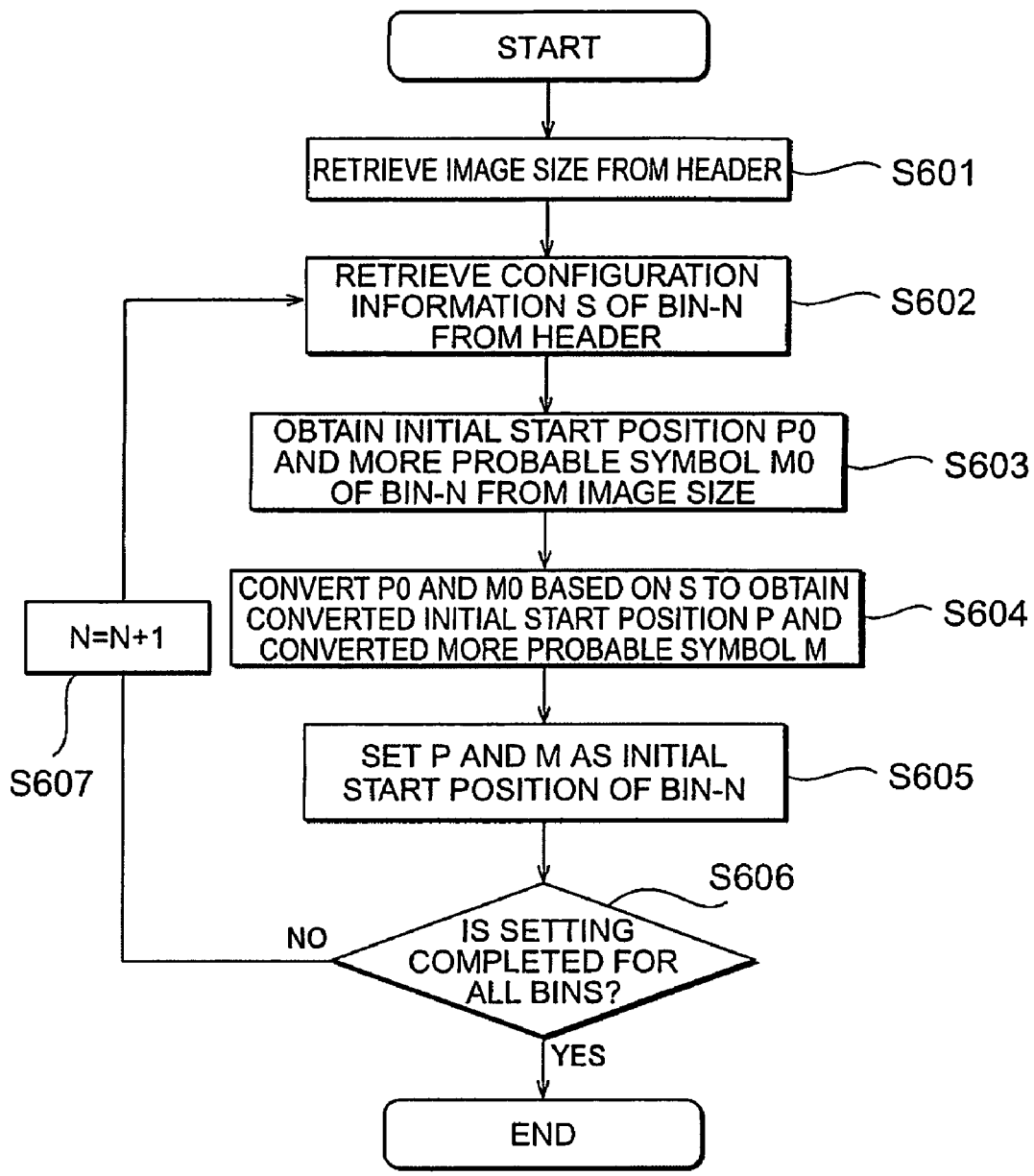
FIG. 25 is a diagram showing the procedure of setting of the initial state number in the arithmetic coding using the state transition diagram.

FIG. 25 shows the procedure of setting the initial state number in the decoding with FIGS. 21 and 22. As shown in FIG. 25, in order to set the initial state number in the decoding, the data about the size of a picture is first retrieved from the header of the video information (S601). Then the configuration information S about binN is retrieved as information about binN from the header (S602). Then the initial start position P0 and the more probable symbol M0 of binN shown in FIG. 21 are read in view of the above size of the picture (S603). Then the initial start position P0 and the more probable symbol M0 are converted based on the configuration information S to obtain converted initial start position P and converted more probable symbol M (S604). The conversion based on the configuration information S is implemented in such a way that the transition is made on the state transition diagram while assuming that with the transition value of the positive direction the MPS is selected by the number of the transition value or while assuming that with the transition value of the negative direction the LPS is selected by the number of the transition value. For example, in FIG. 20, the initial start state P0 is 30, the more probable symbol M0=1, and the transition value of configuration information S is 3, the converted initial start position P obtained is 33. In this case the converted more probable symbol M is still 1 equal to M0. P and M thus obtained by the conversion are set as the initial start position of binN (S605). Thereafter, this processing is repeated for all the bins (S606, S607). These initial state code table and conversion method are just an example, and it is also possible to use any other initial state code table and conversion method.

It is also noted that the utilization of the screen size information herein is just an example and the invention is not limited to this. For example, the initial state may be set by defining the function expressions described in the third embodiment, using the quantization parameter value which is the coding condition for image coding, or it may be set using the information about whether the image is coded by intraframe coding or by interframe coding. Where the variation of probabilities is stepped as in the state transition diagram of FIG. 20, a starting variation state may be notified of by the configuration information so as to permit change in the probability variation at the start. For example, in FIG. 20, #0, #6, and #14 have the same probability, but their slopes of probability variation are different. It is thus possible to assign each of the above states a fixed-length code or a variable-length code and attach it as configuration information to the header.

The following will describe the video encoding program of the fourth embodiment for letting a computer substantialize the video encoding method according to the fourth embodiment. In the configuration information adding step, which the video encoding program lets the computer execute, the initial state number associated with the initial probability table used in coding is converted into a combination of the above previous information with the above configuration information added to the header by the predetermined method. In the coding step, the arithmetic coding is carried out while updating the probability table by the transition of the state number with the state transition diagram as described above. In the configuration information adding step, the aforementioned previous information and configuration information is put into the header attached to the coding signal.

The following will describe the video decoding program of the fourth embodiment for letting a computer substantialize the video decoding method according to the fourth embodiment. In the initial value setting step, which the video decoding program makes the computer execute, the initial state number associated with the initial probability table used in the coding is derived by the combination of the above previous information with the above configuration information attached to the header, by the predetermined method. In the arithmetic decoding step, the arithmetic decoding is carried out while updating the probability table by the transition of the state number with the state transition diagram as described above.

In the above third and fourth embodiments, if a list is used to set the initial value configuration information and the initial state configuration information as in the second embodiment, the number of initial values that can be controlled by one initial value configuration information and initial state configuration information can be one, or a plurality of probability information entities can be controlled together as grouped. The former enables finer initial probability setting, while the latter enables decrease in the information volume of the initial value configuration information and initial state configuration information to be transmitted. How to combine the probability information at this time is desirably to group the probability information of coding elements presenting similar properties into one. For example, in the case of the coding in the macroblock modes shown in FIGS. 3A–3J, the probability information used is not only one, but the arithmetic coding is carried out using a plurality of probability information entities for binarized information of the mode information. It is expected in this case that the probability information about one coding element has a correlation with other probability information, and it is thus desirable to control the initial values by one group including all of them together. In cases where the luminance demonstrates change throughout the entire slice, e.g., where the entire screen becomes dark, it is considered that the property about the DC coefficient out of the DCT coefficients, associated with the luminance, varies. In the coding of the DC coefficient, the probability information used is not only one, but the arithmetic coding is carried out using a plurality of probability information entities for the binarized information of the DC coefficient; therefore, it is desirable to handle these probability information entities together.

For controlling a plurality of probability information entities as grouped together, the initial values of all the probability information entities may be controlled by one code. For example, a potential method is to define initial values for respective sorts of pictures. Since sports pictures tend to have great motion information, the set of initial values of the respective probability information entities can be prepared and set so as to achieve better efficiency with large motion. In contrast, since landscape pictures contain simple motion, the set of initial values can be set so as to achieve better efficiency with small motion.

Figure 13:
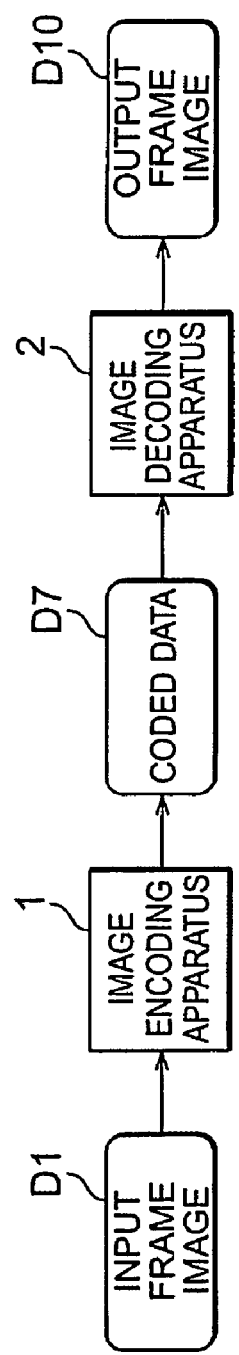
FIG. 13 is a schematic illustration showing a configuration of an embodiment of the image transmission system.
Figure 15:
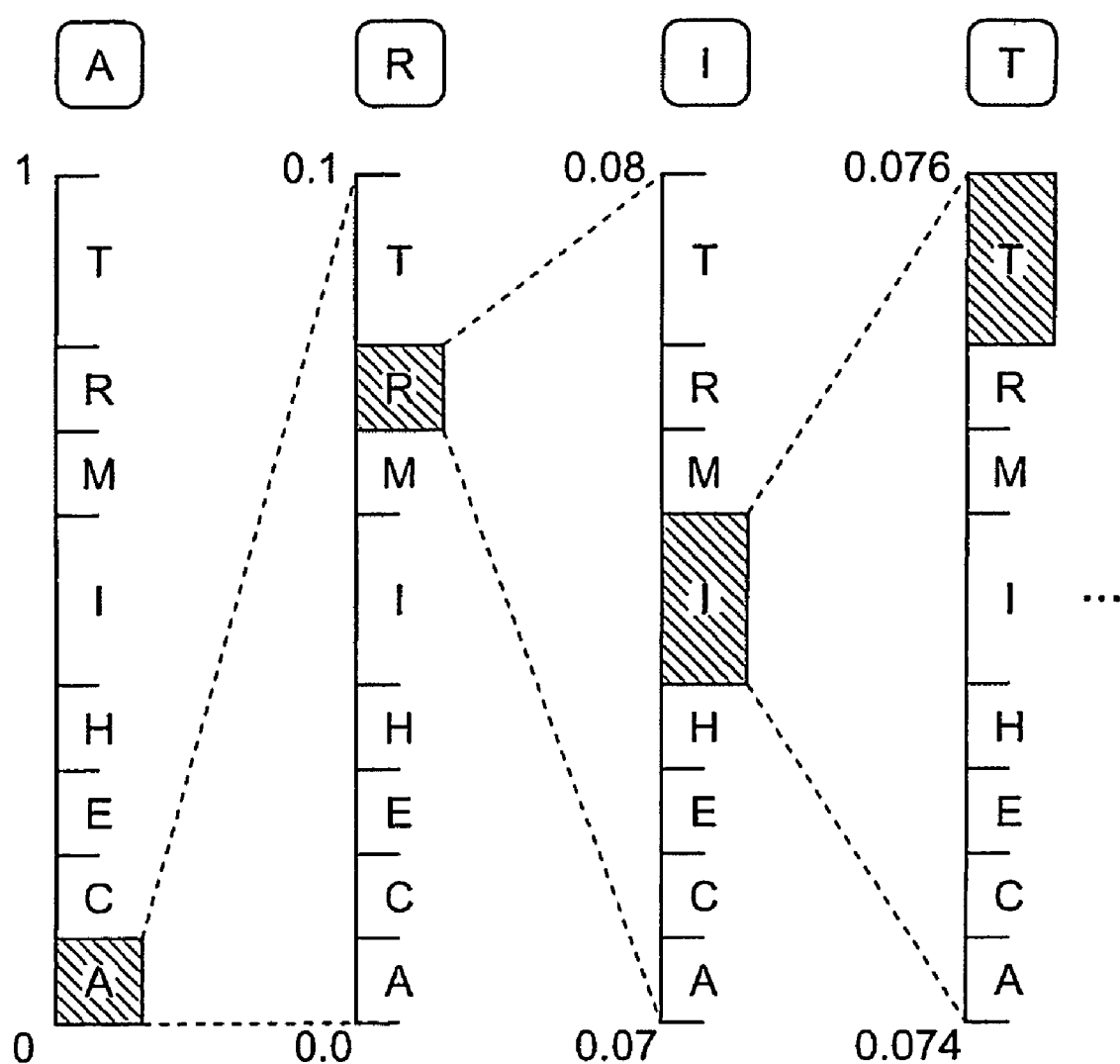
FIG. 15 is an illustration showing the coding of the character string using the probability table shown in FIG. 14.

Lastly, an embodiment of the signal transmission system according to the present invention will be described. An example described herein is an image transmission system configured to encode video information and transmit it. FIG. 13 is an illustration showing the configuration of the image transmission system (e.g., a mobile video transmission system) according to the embodiment. The image transmission system is comprised of an image encoding apparatus (e.g., the image encoding apparatus shown in FIG. 2) to substantialize the image encoding method shown in FIG. 1, and an image decoding apparatus (e.g., the image decoding apparatus shown in FIG. 11) to substantialize the image decoding method shown in FIG. 10.

In the present system, the input frame image D1 is coded in the image encoding apparatus 1 to generate coded data D7, and the coded data is outputted onto a predetermined wire or wireless transmission line. The coded data D7 transmitted through the transmission line from the image encoding apparatus 1 is fed into the image decoding apparatus 2 to be restored as output frame image D10.

The image transmission system of this configuration is able to efficiently encode the image data in each of partition units and efficiently transmit the image.

The present invention provides the signal encoding method, signal encoding apparatus, and signal encoding program capable of achieving the efficient coding, and the signal decoding method, signal decoding apparatus, and signal decoding program capable of achieving the efficient decoding of encoded signal.

What is claimed is:

1. A signal encoding method of dividing a coding target signal into divided units and performing arithmetic coding based on probability-related information initialized at a beginning of the divided units, the signal encoding method comprising the steps of:

analyzing each of the divided units of the coding target signal to derive an initial value of the probability-related information to be used for arithmetic coding of the respective units of the coding target signal, and converting the initial value of the probability-related information into previous information separately attached to a header for the coding target signal and an adjustment value to be combined with the previous information by a predetermined method, to derive configuration information from the adjustment value;

performing the arithmetic coding on each of the divided unites of the coding target signal, based on the configuration information and the previous information; and adding step of adding the header containing the configuration information and the previous information to the coding target signal on which the arithmetic coding has been performed.

2. The signal encoding method according to claim 1, further comprising preparing a list in which candidates for the configuration information are associated with identifiers, wherein adding the header containing the configuration information and the previous information comprises selecting a candidate corresponding to the configuration information from in the list and putting an identifier associated therewith, as the configuration information into the header.

3. The signal encoding method according to claim 2, wherein, where the list contains no candidate for the configuration information, adding the header containing the configuration information and the previous information comprises putting into the header an identifier indicating identification information except for the candidates stored in the list, along with the configuration information.

4. The signal encoding method according to claim 1, wherein in performing the arithmetic coding, on the occasion of coding the coding target signal, the probability related information is updated on the basis of rates of occurrence of respective symbols in the coding target signal and the arithmetic coding of the coding target signal is carried out based on the updated probability-related information.

5. The signal encoding method according to claim 1, wherein analyzing each of the divided units analyze rates of occurrence of respective symbols in the coding target signal in the partition units and deriving the configuration information on the basis of the rates of occurrence.

6. The signal encoding method according to claim 1, wherein the header added in the configuration information adding step contains a presence/absence flag indicating presence or absence of the configuration information, and wherein, where the configuration information is the same as that used for coding of a previous partition unit, the configuration information adding step is configured to set the presence/absence flag to absence and not to put the configuration information into the header.

7. The signal encoding method according to claim 1, wherein the coding target signal is a video coding related signal obtained by effecting a predetermined data transformation operation on video information.

8. The signal encoding method according to claim 7, wherein the video coding related signal is of a layered structure having a sequence layer partitioned by a sequence of video information to be coded, a frame layer partitioned by frames of the video information to be coded, and a slice layer resulting from partitioning of the frames each into one or more slices, and wherein the configuration information adding step is configured to put the configuration information into a header of a partition unit in either one of the sequence layer, the frame layer, and the slice layer.

9. The signal encoding method according to claim 7, wherein the video coding related signal is of a layered structure having a sequence layer partitioned by a sequence of video information to be coded, a frame layer partitioned by frames of the video information to be coded, and a slice layer resulting from partitioning of the frames each into one or more slices, and wherein the configuration information adding step is configured to put the configuration information into a header in the slice layer.

10. A signal decoding method of performing arithmetic decoding on each of divided unites of a coded signal, the signal decoding method comprising the step of:

setting an initial value of probability-related information, based on previous information in a header of the coded signal and based on configuration information included in the header of the coded signal, wherein the configuration information is combined with the previous information, using a predetermined method, to derive the initial value of the probability-related information to be used for the arithmetic decoding of the divided units of the coded target signal; and performing the arithmetic decoding on each of the divided unites of the coded signal on the basis of the probability-related information, the initial value of which has been set.

11. The signal decoding method according to claim 10, further comprising preparing a list in which candidates for the configuration information used as the initial values of the probability-related information are associated with identifiers, wherein the header contains an identifier of a candidate selected as the configuration information from in the list, and wherein setting an initial value of probability-related information comprises extracting the configuration information from the list on the basis of the identifier in the header and setting the initial value of the probability-related information on the basis of the extracted configuration information.

12. The signal decoding method according to claim 11, wherein, where the identifier in the header is absent in the list, setting an initial value of probability-related information comprises setting the initial value of the probability-related information on the basis of the configuration information in the header.

13. The signal decoding method according to claim 10, wherein in performing the arithmetic decoding, on the occasion of performing the arithmetic decoding of the coded signal, the probability-related information is updated on the basis of rates of occurrence of respective symbols in the coded signal and the arithmetic decoding of the coded target signal is carried out based on the updated probability-related information.

14. The signal decoding method according to claim 10, wherein the header contains a presence/absence flag indicating presence or absence of the configuration information, and
wherein setting an initial value of probability-related information comprises setting the initial value of the probability-related information on the basis of the configuration information used for coding of a previous partition unit, when the presence/absence flag indicates absence.

15. The signal decoding method according to claim 10, wherein the coded signal is a coded, video coding related signal obtained by effecting a predetermined data transformation operation on video information.

16. The signal decoding method according to claim 15, wherein the coded signal is of a layered structure having a sequence layer partitioned by a sequence of the video information coded, a frame layer partitioned by frames of the video information coded, and a slice layer resulting from partitioning of the frames each into one or more slices, and wherein the initial value setting step is configured to set the initial value of the probability-related information on the basis of the configuration information in a header of a partition unit in either one of the sequence layer, the frame layer, and the slice layer.

17. The signal decoding method according to claim 15, wherein the coded signal is of a layered structure having a sequence layer partitioned by a sequence of video information coded, a frame layer partitioned by frames of the video information coded, and a slice layer resulting from partitioning of each frame into one or more slices, and
wherein the initial value setting step is configured to set the initial value of the probability-related information on the basis of the configuration information in a header in the slice layer.

18. A signal encoding apparatus for dividing a coding target signal into divided units and performing arithmetic coding based on probability-related information initialized at a beginning of the divided units, the signal encoding apparatus comprising:
configuration information deriving means for analyzing each of the divided units of the coding target signal to derive an initial value of the probability-related information to be used for the arithmetic coding on the respective unites of the coding target signal, and converting the initial value of the probability-related information into previous information separately attached to a header for the coding target signal and an adjustment value to be combined with the previous information by a predetermined method, to derive the configuration information from the adjustment value as configuration information;
coding means for performing the arithmetic coding on each of the divided unites of the coding target signal, based on the configuration information and the previous information; and
configuration information adding means for adding the header containing the configuration information and the previous information to the arithmetic coding has been performed.

19. A signal decoding apparatus for performing arithmetic decoding on divided unites of a coded signal, the signal decoding apparatus comprising:
initial value setting means for setting an initial value of probability-related information, based on previous information in a header of the coded signal and based on configuration information included in the header of the coded signal,
wherein the configuration information is combined with the previous information, using a predetermined method, to derive the initial values of the probability-related information to be used for the arithmetic decoding of the divided unites of the coded target signal; and
arithmetic decoding means for performing the arithmetic decoding on each of the divided unites of the coded signal on the basis of the probability-related information the initial value of which has been set by the initial value setting means.

20. A storage comprising a signal encoding program for dividing a coding target signal into divided units and performing arithmetic coding based on probability-related information initialized at a beginning of the divided units, the signal encoding program comprising the logics of:
analyzing each of the divided unites of the coding target signal to derive an initial value of the probability-related information to be used for the arithmetic coding of the divided unites of the coding target signal, and converting the initial value of the probability-related information into previous information separately attached to a header for the coding target signal and an adjustment value to be combined with the previous information by a predetermined method, to derive configuration information from the adjustment value;
performing the arithmetic coding on each of the divided unites of the coding target signal, based on the configuration information and the previous information; and
adding the header containing the configuration information and the previous information to the coding target sighnal on which the arithmetic coding has been performed.

21. A storage comprising a signal decoding program for performing arithmetic decoding on divided unites of a coded signal, the signal decoding program comprising the logics of:
setting an initial value of probability-related information, based on previous information in a header of the coded signal and based on configuration information included in the header of the coded signal,
wherein the configuration information is combined with the previous information, using a predetermined method, to derive the initial values of the probability-related information to be used for the arithmetic decoding of the divided units of the coded target signal; and performing the arithmetic decoding on each of the divided unites of the coded signal on the basis of the probability-related information the initial value of which has been set.

22. A signal encoding method of dividing a coding target signal into divided units and performing arithmetic coding on each of the divided units of the coding target signal, using a state transition diagram in which state numbers are each associated with values of probability-related information, the signal encoding method comprising the steps of:
   analyzing each of the divided units of the coding target signal to derive an initial value of the probability-related information to be used for the arithmetic coding of the divided units of the coding target signal, and converting a state number associated with the initial value of the probability-related information, into a value derived based on previous information separately attached to a header for the coding target signal and an adjustment value to be combined with the mentioned value by a predetermined method, to derive configuration information from the adjustment value;
   performing the arithmetic coding on each of the divided units of the coding target signal in each of the partition units, based on the initial value of the probability-related information; and
   adding the header containing the previous information and the configuration information to the coding target signal on which the arithmetic coding has been performed.

23. The signal encoding method according to claim 22, comprising preparing a list in which candidates for the configuration information are associated with identifiers, wherein the configuration information adding step is configured to select a candidate corresponding to the configuration information derived in the configuration information deriving step, from in the list and put an identifier associated therewith, as the configuration information into the header.

24. The signal encoding method according to claim 23, wherein, where the list contains no candidate for the configuration information derived in the configuration information deriving step, the configuration information adding step is configured to put into the header an identifier indicating identification information except for the candidates stored in the list, along with the configuration information derived in the configuration information deriving step.

25. The signal encoding method according to claim 22, wherein in the coding step, on the occasion of coding the coding target signal, the probability-related information is updated on the basis of rates of occurrence of respective symbols in the coding target signal and the arithmetic coding of the coding target signal is carried out based on the updated probability-related information.

26. The signal encoding method according to claim 22, wherein the configuration information deriving step is configured to analyze rates of occurrence of respective symbols in the coding target signal in the partition units and derive the configuration information on the basis of the rates of occurrence.

27. The signal encoding method according to claim 22, wherein the header added in the configuration information adding step contains a presence/absence flag indicating presence or absence of the configuration information, and
   wherein, where the configuration information is the same as that used for coding of a previous partition unit, the configuration information adding step is configured to set the presence/absence flag to absence and not to put the configuration information into the header.

28. The signal encoding method according to claim 22, wherein the coding target signal is a video coding related signal obtained by effecting a predetermined data transformation operation on video information.

29. The signal encoding method according to claim 28, wherein the video coding related signal is of a layered structure having a sequence layer partitioned by a sequence of video information to be coded, a frame layer partitioned by frames of the video information to be coded, and a slice layer resulting from partitioning of the frames each into one or more slices, and
   wherein the configuration information adding step is configured to put the configuration information into a header of a partition unit in either one of the sequence layer, the frame layer, and the slice layer.

30. The signal encoding method according to claim 28, wherein the video coding related signal is of a layered structure having a sequence layer partitioned by a sequence of video information to be coded, a frame layer partitioned by frames of the video information to be coded, and a slice layer resulting from partitioning of the frames each into one or more slices, and
   wherein the configuration information adding step is configured to put the configuration information into a header in the slice layer.

31. A signal decoding method of performing arithmetic decoding on divided units of a coded signal, using a state transition diagram in which state numbers are each associated with values of probability-related information, the signal decoding method comprising the steps of:
   deriving an initial state number, based on previous information and configuration information to be combined with the previous information, included in a header of the coded signal,
   wherein the initial state number is associated with an initial value of the probability-related information to be used for the arithmetic decoding of the divided units of the coded target signal; and
   performing the arithmetic decoding on the coded signal on the basis of the initial value of the probability-related information.

32. The signal decoding method according to claim 31, comprising preparing a list in which candidates for the configuration information used as the initial values of the probability-related information are associated with identifiers,
   wherein the header contains an identifier of a candidate selected as the configuration information from in the list, and
   wherein the initial value setting step is configured to extract the configuration information from the list on the basis of the identifier in the header and set the initial value of the probability-related information on the basis of the extracted configuration information.

33. The signal decoding method according to claim 32, wherein, where the identifier in the header is absent in the list, the initial value setting step is configured to set the initial value of the probability-related information on the basis of the configuration information in the header.

34. The signal decoding method according to claim 31, wherein in the arithmetic decoding step, on the occasion of performing the arithmetic decoding of the coded signal, the probability-related information is updated on the basis of rates of occurrence of respective symbols in the coded signal and the arithmetic decoding of the coded target signal is carried out based on the updated probability-related information.

35. The signal decoding method according to claim 31, wherein the header contains a presence/absence flag indicating presence or absence of the configuration information, and wherein the initial value setting step is configured to set the initial value of the probability-related information on the basis of the configuration information used for coding of a previous partition unit, when the presence/absence flag indicates absence.

36. The signal decoding method according to claim 31, wherein the coded signal is a coded, video coding related signal obtained by effecting a predetermined data transformation operation on video information.

37. The signal decoding method according to claim 36, wherein the coded signal is of a layered structure having a sequence layer partitioned by a sequence of the video information coded, a frame layer partitioned by frames of the video information coded, and a slice layer resulting from partitioning of the frames each into one or more slices, and wherein the initial value setting step is configured to set the initial value of the probability-related information on the basis of the configuration information in a header of a partition unit in either one of the sequence layer, the frame layer, and the slice layer.

38. The signal decoding method according to claim 36, wherein the coded signal is of a layered structure having a sequence layer partitioned by a sequence of video information coded, a frame layer partitioned by frames of the video information coded, and a slice layer resulting from partitioning of each frame into one or more slices, and wherein the initial value setting step is configured to set the initial value of the probability-related information on the basis of the configuration information in a header in the slice layer.

39. A signal encoding apparatus for dividing a coding target signal into divided units and performing arithmetic coding on each of the divided units of the coding target signal, using a state transition diagram in which state numbers are each associated with values of probability-related information, the signal encoding apparatus comprising:

configuration information deriving means for analyzing each of the divided units of the coding target signal to derive an initial value of the probability-related information to be used for the arithmetic coding of the divided units of the coding target signal, and converting a state number associated with the initial value of the probability-related information, into a value derived based on previous information separately attached to a header for the coding target signal and an adjustment value to be combined with the mentioned value by a predetermined method, to derive configuration information from the adjustment value;

coding means for performing the arithmetic coding on each of the divided units of the coding target signal, based on the initial value of the probability-related information derived by the configuration information deriving means; and configuration information adding means for adding the header containing the previous information and the configuration information to the coding target signal on which the arithmetic coding has been performed.

40. A signal decoding apparatus for performing arithmetic decoding on divided unites of a coded signal, using a state transition diagram in which state numbers are each associated with values of probability-related information, the signal decoding apparatus comprising:

initial value setting means for deriving an initial state number, based on previous information and configuration information to be combined with the previous information, included in a header of the coded signal, wherein the initial state number is associated with an initial value of the probability-related information to be used for the arithmetic decoding of the divided units of the coded target signal; and arithmetic decoding means for performing the arithmetic decoding on the coded signal on the basis of the initial value of the probability-related information.

41. A storage comprising a signal encoding program for dividing a coding target signal into divided units and performing arithmetic coding on each of the divided units of the coding target signal using a state transition diagram in which state numbers are each associated with values of probability-related information, the signal encoding program comprising the logics of:

analyzing each of the divided units of the coding target signal to derive an initial value of the probability-related information to be used for the arithmetic coding of the divided units of the coding target signal, and converting a state number associated with the initial value of the probability-related information, into a value derived based on previous information separately attached to a header for the coding target signal and an adjustment value to be combined with the mentioned value by a predetermined method, to derive configuration information from the adjustment value;

performing the arithmetic coding on each of the divided units of the coding target signal, based on the initial value of the probability-related information derived; and adding the header containing the previous information and the configuration information to the coding target signal on which the arithmetic coding has been performed.

42. A storage comprising a signal decoding program for performing arithmetic decoding on divided units of a coded signal, using a state transition diagram in which state numbers are each associated with values of probability-related information, the signal decoding program comprising the logics of:

deriving an initial state number, based on previous information and configuration information to be combined with the previous information, included in a header of the coded signal, wherein the initial state number is associated with the initial value of the probability-related information to be used in the arithmetic decoding of the divided units of the coded target signal; and performing the arithmetic decoding on the coded signal on the basis of the initial value of the probability-related information.

43. A signal encoding method of dividing a coding target signal as an object of coding into partition units and performing arithmetic coding based on probability-related information initialized at the head of the partition units, the signal encoding method comprising:

a configuration information deriving step of analyzing the coding target signal in each of the partition units to derive as configuration information, information about an initial value for initialization of the probability-related information used in the arithmetic coding of the coding target signal in the partition unit in question;

a coding step of performing the arithmetic coding of the coding target signal in each of the partition units, based on the configuration information; and a configuration information adding step of adding a header containing the configuration information to the arithmetic-coded signal in each of the partition units;

wherein the configuration information deriving step is configured to derive the configuration information by combining the initial value of the probability-related information derived by analyzing the coding target signal, with information separately attached as previous information of the coding target signal to the header, by a predetermined method.

44. The signal encoding method according to claim 43, comprising preparing a list in which candidates for the configuration information are associated with identifiers, wherein the configuration information adding step is configured to select a candidate corresponding to the configuration information derived in the configuration information deriving step, from in the list and put an identifier associated therewith, as the configuration information into the header.

45. The signal encoding method according to claim 44, wherein, where the list contains no candidate for the configuration information derived in the configuration information deriving step, the configuration information adding step is configured to put into the header an identifier indicating identification information except for the candidates stored in the list, along with the configuration information derived in the configuration information deriving step.

46. The signal encoding method according to claim 43, wherein in the coding step, on the occasion of coding the coding target signal, the probability-related information is updated on the basis of rates of occurrence of respective symbols in the coding target signal and the arithmetic coding of the coding target signal is carried out based on the updated probability-related information.

47. The signal encoding method according to claim 43, wherein the configuration information deriving step is configured to analyze rates of occurrence of respective symbols in the coding target signal in the partition units and derive the configuration information on the basis of the rates of occurrence.

48. The signal encoding method according to claim 43, wherein the header added in the configuration information adding step contains a presence/absence flag indicating presence or absence of the configuration information, and wherein, where the configuration information is the same as that used for coding of a previous partition unit, the configuration information adding step is configured to set the presence/absence flag to absence and not to put the configuration information into the header.

49. The signal encoding method according to claim 43, wherein the coding target signal is a video coding related signal obtained by effecting a predetermined data transformation operation on video information.

50. The signal encoding method according to claim 49, wherein the video coding related signal is of a layered structure having a sequence layer partitioned by a sequence of video information to be coded, a frame layer partitioned by frames of the video information to be coded, and a slice layer resulting from partitioning of the frames each into one or more slices, and wherein the configuration information adding step is configured to put the configuration information into a header of a partition unit in either one of the sequence layer, the frame layer, and the slice layer.

51. The signal encoding method according to claim 49, wherein the video coding related signal is of a layered structure having a sequence layer partitioned by a sequence of video information to be coded, a frame layer partitioned by frames of the video information to be coded, and a slice layer resulting from partitioning of the frames each into one or more slices, and wherein the configuration information adding step is configured to put the configuration information into a header in the slice layer.

52. A signal decoding method of performing arithmetic decoding on divided units of a coded signal, the signal decoding method comprising the steps of:

setting an initial value of probability-related information on the basis of configuration information which is included in a header attached to the coded signal, wherein the initial value is used for initializing the probability-related information to be used for the arithmetic decoding of the divided units of the coded target signal; and performing the arithmetic decoding on each of the divided units of the coded signal on the basis of the probability-related information the initial value of which has been set;

wherein the initial values of the probability-related information is set by combining the configuration information in the header attached to the coded signal, with previous information in the header of the coded signal, using a predetermined method.

53. The signal decoding method according to claim 52, comprising preparing a list in which candidates for the configuration information used as the initial values of the probability-related information are associated with identifiers, wherein the header contains an identifier of a candidate selected as the configuration information from in the list, and wherein the initial value setting step is configured to extract the configuration information from the list on the basis of the identifier in the header and set the initial value of the probability-related information on the basis of the extracted configuration information.

54. The signal decoding method according to claim 53, wherein, where the identifier in the header is absent in the list, the initial value setting step is configured to set the initial value of the probability-related information on the basis of the configuration information in the header.

55. The signal decoding method according to claim 52, wherein in the arithmetic decoding step, on the occasion of performing the arithmetic decoding of the coded signal, the probability-related information is updated on the basis of rates of occurrence of respective symbols in the coded signal and the arithmetic decoding of the coded target signal is carried out based on the updated probability-related information.

56. The signal decoding method according to claim 52, wherein the header contains a presence/absence flag indicating presence or absence of the configuration information, and wherein the initial value setting step is configured to set the initial value of the probability-related information on the basis of the configuration information used for coding of a previous partition unit, when the presence/absence flag indicates absence.

57. The signal decoding method according to claim 52, wherein the coded signal is a coded, video coding related signal obtained by effecting a predetermined data transformation operation on video information.

58. The signal decoding method according to claim 57, wherein the coded signal is of a layered structure having a sequence layer partitioned by a sequence of the video information coded, a frame layer partitioned by frames of the video information coded, and a slice layer resulting from partitioning of the frames each into one or more slices, and wherein the initial value setting step is configured to set the initial value of the probability-related information on the basis of the configuration information in a header of a partition unit in either one of the sequence layer, the frame layer, and the slice layer.

59. The signal decoding method according to claim 57, wherein the coded signal is of a layered structure having a sequence layer partitioned by a sequence of video information coded, a frame layer partitioned by frames of the video information coded, and a slice layer resulting from partitioning of each frame into one or more slices, and wherein the initial value setting step is configured to set the initial value of the probability-related information on the basis of the configuration information in a header in the slice layer.

60. A signal encoding method of dividing a coding target signal as an object of coding into partition units and performing arithmetic coding based on probability-related information initialized at the head of the partition units, the signal encoding method comprising:

a configuration information deriving step of analyzing the coding target signal in each of the partition units to derive as configuration information, information about an initial value for initialization of the probability-related information used in the arithmetic coding of the coding target signal in the partition unit in question;

a coding step of performing the arithmetic coding of the coding target signal in each of the partition units, based on the configuration information; and a configuration information adding step of adding a header containing the configuration information to the arithmetic-coded signal in each of the partition units.

61. The signal encoding method according to claim 60, wherein the configuration information deriving step is configured to define the initial value of the probability-related information itself as the configuration information.

62. The signal encoding method according to claim 60, wherein the configuration information deriving step is configured to define as the configuration information, differences of the initial value of the probability-related information derived by analyzing the coding target signal, from a predetermined value.

63. The signal encoding method according to claims 60, comprising preparing a list in which candidates for the configuration information are associated with identifiers, wherein the configuration information adding step is configured to select a candidate corresponding to the configuration information derived in the configuration information deriving step, from in the list and put an identifier associated therewith, as the configuration information into the header.

64. The signal encoding method according to claim 63, wherein, where the list contains no candidate for the configuration information derived in the configuration information deriving step, the configuration information adding step is configured to put into the header an identifier indicating identification information except for the candidates stored in the list, along with the configuration information derived in the configuration information deriving step.

65. The signal encoding method according to claim 60, wherein in the coding step, on the occasion of coding the coding target signal, the probability-related information is updated on the basis of rates of occurrence of respective symbols in the coding target signal and the arithmetic coding of the coding target signal is carried out based on the updated probability-related information.

66. The signal encoding method according to claim 60, wherein the configuration information deriving step is configured to analyze rates of occurrence of respective symbols in the coding target signal in the partition units and derive the configuration information on the basis of the rates of occurrence.

67. The signal encoding method according to claim 60, wherein the coding target signal is a video coding related signal obtained by effecting a predetermined data transformation operation on video information.

68. The signal encoding method according to claim 60, wherein the header added in the configuration information adding step contains a presence/absence flag indicating presence or absence of the configuration information, and wherein, where the configuration information is the same as that used for coding of a previous partition unit, the configuration information adding step is configured to set the presence/absence flag to absence and not to put the configuration information into the header.

69. The signal encoding method according to claim 67, wherein the video coding related signal is of a layered structure having a sequence layer partitioned by a sequence of video information to be coded, a frame layer partitioned by frames of the video information to be coded, and a slice layer resulting from partitioning of the frames each into one or more slices, and wherein the configuration information adding step is configured to put the configuration information into a header of a partition unit in either one of the sequence layer, the frame layer, and the slice layer.

70. The signal encoding method according to claim 67, wherein the video coding related signal is of a layered structure having a sequence layer partitioned by a sequence of video information to be coded, a frame layer partitioned by frames of the video information to be coded, and a slice layer resulting from partitioning of the frames each into one or more slices, and wherein the configuration information adding step is configured to put the configuration information into a header in the slice layer.

71. A signal decoding method of performing arithmetic decoding of a coded signal in partition units, the signal decoding method comprising:

an initial value setting step of setting an initial value of probability-related information on the basis of configuration information which is information about the initial value for initialization of the probability-related information used in the arithmetic decoding of the coded target signal in the partition unit and which is included in a header attached to the coded signal; and an arithmetic decoding step of performing the arithmetic decoding of the coded signal in each of the partition units on the basis of the probability-related information the initial values of which were set in the initial value setting step.

72. The signal decoding method according to claim 71 wherein the initial value setting step is configured to set the configuration information included in the header as the initial values.

73. The signal decoding method according to claim 71, wherein the initial value setting step is configured to set as the initial value, a value obtained by adding a predetermined value to the configuration information in the header.

74. The signal decoding method according to claim 71, comprising preparing a list in which candidates for the configuration information used as the initial values of the probability-related information are associated with identifiers,
wherein the header contains an identifier of a candidate selected as the configuration information from in the list, and
wherein the initial value setting step is configured to extract the configuration information from the list on the basis of the identifier in the header and set the initial value of the probability-related information on the basis of the extracted configuration information.

75. The signal decoding method according to claim 74, wherein, where the identifier in the header is absent in the list, the initial value setting step is configured to set the initial value of the probability-related information on the basis of the configuration information in the header.

76. The signal decoding method according to claim 71, wherein in the arithmetic decoding step, on the occasion of performing the arithmetic decoding of the coded signal, the probability-related information is updated on the basis of rates of occurrence of respective symbols in the coded signal and the arithmetic decoding of the coded target signal is carried out based on the updated probability-related information.

77. The signal decoding method according to claim 71, wherein the header contains a presence/absence flag indicating presence or absence of the configuration information, and
wherein the initial value setting step is configured to set the initial value of the probability-related information on the basis of the configuration information used for coding of a previous partition unit, when the presence/absence flag indicates absence.

78. The signal decoding method according to claim 71, wherein the coded signal is a coded, video coding related signal obtained by effecting a predetermined data transformation operation on video information.

79. The signal decoding method according to claim 78, wherein the coded signal is of a layered structure having a sequence layer partitioned by a sequence of the video information coded, a frame layer partitioned by frames of the video information coded, and a slice layer resulting from partitioning of the frames each into one or more slices, and
wherein the initial value setting step is configured to set the initial value of the probability-related information on the basis of the configuration information in a header of a partition unit in either one of the sequence layer, the frame layer, and the slice layer.

80. The signal decoding method according to claim 78, wherein the coded signal is of a layered structure having a sequence layer partitioned by a sequence of video information coded, a frame layer partitioned by frames of the video information coded, and a slice layer resulting from partitioning of each frame into one or more slices, and
wherein the initial value setting step is configured to set the initial value of the probability-related information on the basis of the configuration information in a header in the slice layer.

81. A signal encoding apparatus for dividing a coding target signal as an object of coding into partition units and performing arithmetic coding based on probability-related information initialized at the head of the partition units, the signal encoding apparatus comprising:
configuration information deriving means for analyzing the coding target signal in each of the partition units to derive as configuration information, information about an initial value for initialization of the probability-related information used in the arithmetic coding of the coding target signal in the partition unit in question;
coding means for performing the arithmetic coding of the coding target signal in each of the partition units, based on the configuration information; and
configuration information adding means for adding a header containing the configuration information to the arithmetic-coded signal in each of the partition units.

82. A signal decoding apparatus for performing arithmetic decoding of a coded signal in partition units, the signal decoding apparatus comprising:
initial value setting means for setting an initial value of probability-related information on the basis of configuration information which is information about the initial value for initialization of the probability-related information used in the arithmetic decoding of the coded target signal in the partition unit and which is included in a header attached to the coded signal; and
arithmetic decoding means for performing the arithmetic decoding of the coded signal in each of the partition units on the basis of the probability-related information the initial value of which was set by the initial value setting means.

83. A signal encoding program for dividing a coding target signal as an object of coding into partition units and performing arithmetic coding based on probability-related information initialized at the head of the partition units, the signal encoding program letting a computer execute:
a configuration information deriving step of analyzing the coding target signal in each of the partition units to derive as configuration information, information about an initial value for initialization of the probability-related information used in the arithmetic coding of the coding target signal in the partition unit in question;
a coding step of performing the arithmetic coding of the coding target signal in each of the partition units, based on the configuration information; and
a configuration information adding step of adding a header containing the configuration information to the arithmetic-coded signal in each of the partition units.

84. A signal decoding program for performing arithmetic decoding of a coded signal in partition units, the signal decoding program letting a computer execute:
an initial value setting step of setting an initial value of probability-related information on the basis of configuration information which is information about the initial values for initialization of the probability-related information used in the arithmetic decoding of the coded target signal in the partition unit and which is included in a header attached to the coded signal; and
an arithmetic decoding step of performing the arithmetic decoding of the coded signal in each of the partition units on the basis of the probability-related information the initial value of which was set in the initial value setting step.

* * * * *

UNITED STATES PATENT AND TRADEMARK OFFICE
CERTIFICATE OF CORRECTION

PATENT NO. : 7,190,289 B2
APPLICATION NO. : 10/972952
DATED : March 13, 2007
INVENTOR(S) : Kobayashi et al.

It is certified that error appears in the above-identified patent and that said Letters Patent is hereby corrected as shown below:

On the Title page,

[*] Notice:  Subject to any disclaimer, the term of this patent is extended or adjusted under 35 USC 154(b) by (1) days Delete the phrase "by 1" and insert -- by 0 days--

Signed and Sealed this

Fifth Day of June, 2007

JON W. DUDAS
*Director of the United States Patent and Trademark Office*